United States Patent
Lu et al.

(10) Patent No.: US 8,604,613 B2
(45) Date of Patent: Dec. 10, 2013

(54) ELECTRONIC ASSEMBLY HAVING A MULTILAYER ADHESIVE STRUCTURE

(75) Inventors: Su-Tsai Lu, Hsinchu (TW); Tai-Hong Chen, Hsinchu (TW)

(73) Assignee: Industrial Technology Research Institute, Hsinchu (TW)

(*) Notice: Subject to any disclaimer, the term of this patent is extended or adjusted under 35 U.S.C. 154(b) by 433 days.

(21) Appl. No.: 12/237,578

(22) Filed: Sep. 25, 2008

(65) Prior Publication Data

US 2009/0026611 A1 Jan. 29, 2009

Related U.S. Application Data

(60) Continuation-in-part of application No. 12/020,508, filed on Jan. 25, 2008, now Pat. No. 7,960,830, which is a continuation-in-part of application No. 11/644,184, filed on Dec. 22, 2006, now Pat. No. 7,348,271, which is a division of application No. 10/714,277, filed on Nov. 14, 2003, now Pat. No. 7,154,176.

(51) Int. Cl.
*H01L 23/48* (2006.01)
*H01L 23/52* (2006.01)
*H01L 29/40* (2006.01)

(52) U.S. Cl.
USPC ............... 257/737; 257/784; 257/E23.068; 257/E21.508

(58) Field of Classification Search
None
See application file for complete search history.

(56) References Cited

U.S. PATENT DOCUMENTS

| | | | |
|---|---|---|---|
| 5,393,697 A | 2/1995 | Chang et al. | |
| 5,431,328 A | 7/1995 | Chang et al. | |
| 5,477,087 A * | 12/1995 | Kawakita et al. | 257/737 |
| 5,508,228 A | 4/1996 | Nolan et al. | |
| 5,578,527 A | 11/1996 | Chang et al. | |
| 5,783,465 A * | 7/1998 | Canning et al. | 438/119 |
| 5,877,556 A * | 3/1999 | Jeng et al. | 257/737 |
| 6,284,086 B1 | 9/2001 | Cardellino et al. | |
| 6,333,555 B1 | 12/2001 | Farnworth et al. | |
| 6,426,566 B1 | 7/2002 | Sawamoto | |
| 6,518,097 B1 | 2/2003 | Yin et al. | |
| 6,537,854 B1 * | 3/2003 | Chang et al. | 438/118 |
| 7,154,176 B2 * | 12/2006 | Huang et al. | 257/737 |
| 2002/0048924 A1 | 4/2002 | Lay et al. | |
| 2003/0183933 A1 | 10/2003 | Kobayashi | |
| 2003/0214035 A1 | 11/2003 | Kwon et al. | |
| 2004/0219715 A1 | 11/2004 | Kwon et al. | |
| 2005/0098901 A1 * | 5/2005 | Chang et al. | 257/780 |
| 2005/0184389 A1 * | 8/2005 | Chen et al. | 257/737 |
| 2006/0091539 A1 * | 5/2006 | Tanaka | 257/737 |

(Continued)

OTHER PUBLICATIONS

Longitudinal. (n.d.) The American Heritage® Dictionary of the English Language, Fourth Edition. (2003). Retrieved Oct. 24, 2012 from http://www.thefreedictionary.com/longitudinal.*

(Continued)

*Primary Examiner* — Michael Jung
(74) *Attorney, Agent, or Firm* — Alston & Bird LLP

(57) ABSTRACT

An electronic device comprises a substrate and a number of bump units over the substrate, wherein each of the bump units includes an electrically insulating bump-forming body extending in a first direction, and at least two conductive layers separated from each other on the electrically insulating bump-forming body, the at least two conductive layers extending in a second direction orthogonal to the first direction.

14 Claims, 27 Drawing Sheets

(56) References Cited

U.S. PATENT DOCUMENTS

| | | | |
|---|---|---|---|
| 2007/0102815 A1* | 5/2007 | Kaufmann et al. | 257/737 |
| 2008/0284011 A1* | 11/2008 | Chang et al. | 257/737 |
| 2009/0057924 A1* | 3/2009 | Imai | 257/784 |

OTHER PUBLICATIONS

Notice of Allowance for U.S. Appl. No. 12/020,508 dated Jan. 31, 2011.

Office Action mailed Oct. 6, 2010, for U.S. Appl. No. 12/020,508.

* cited by examiner

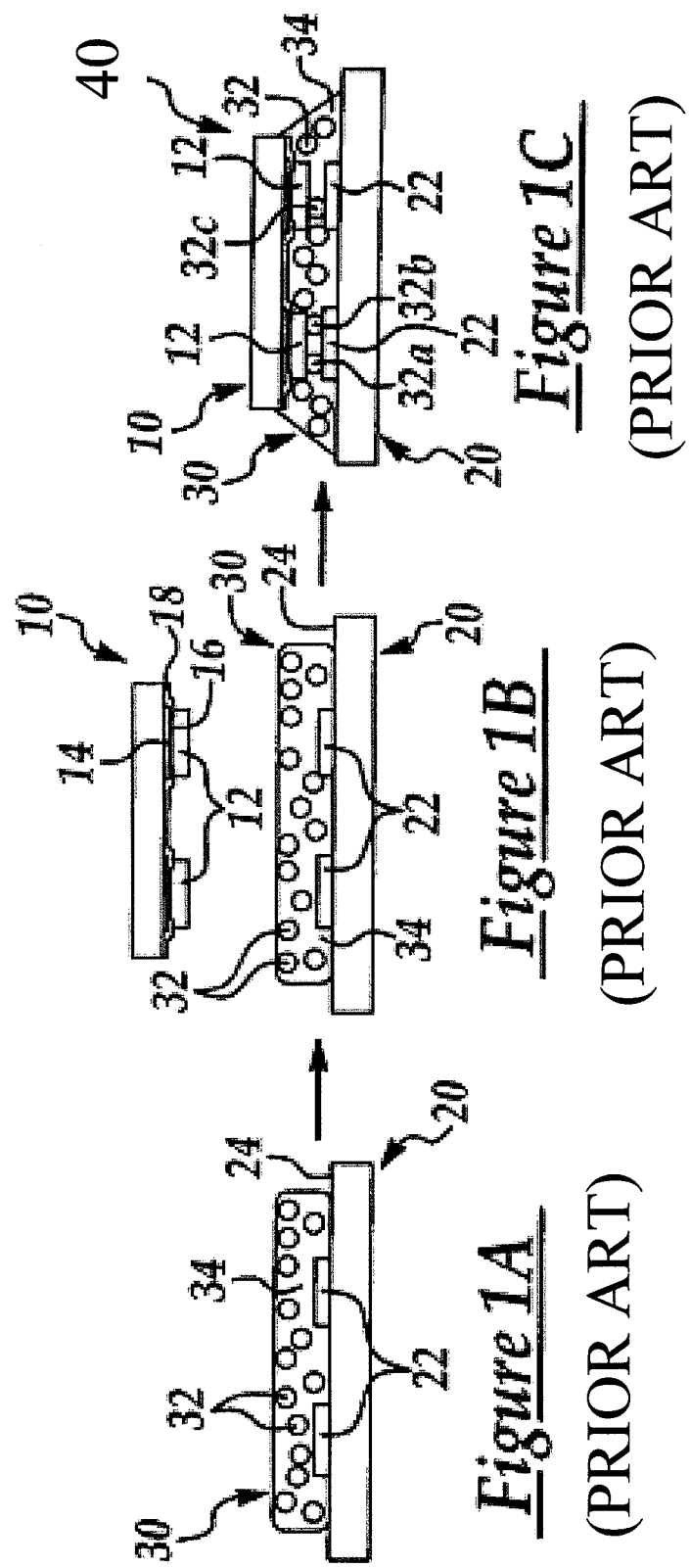

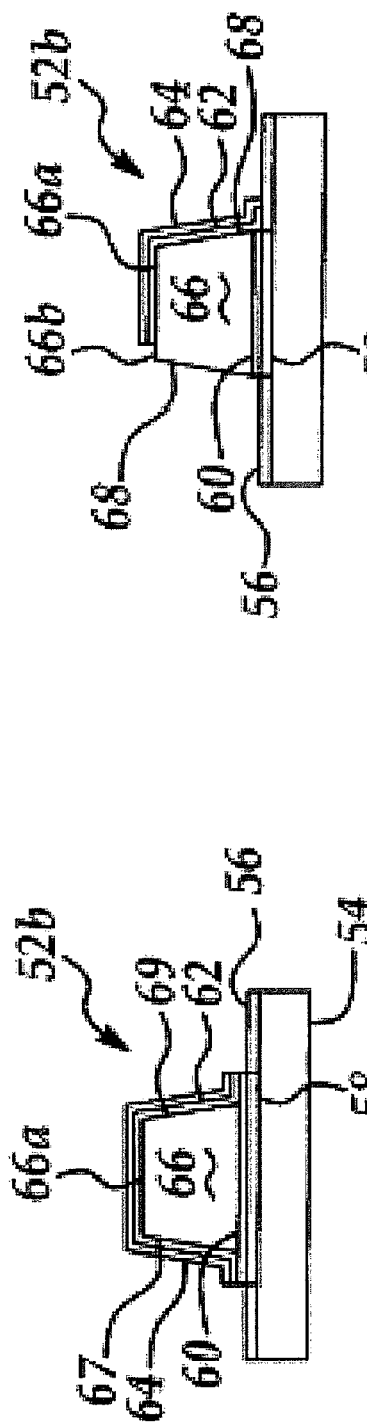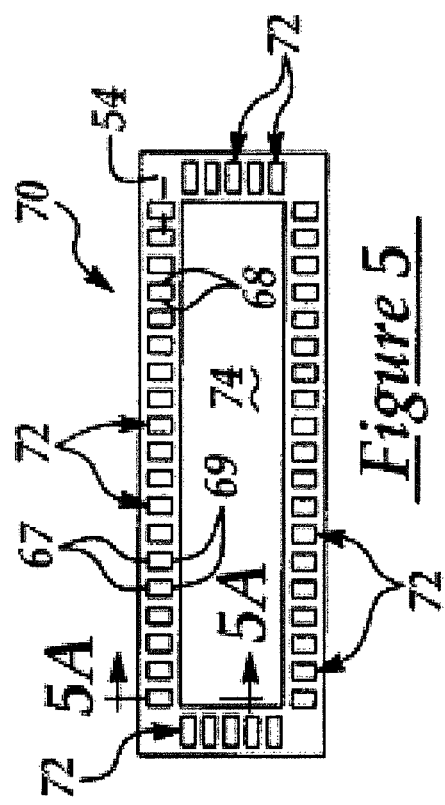

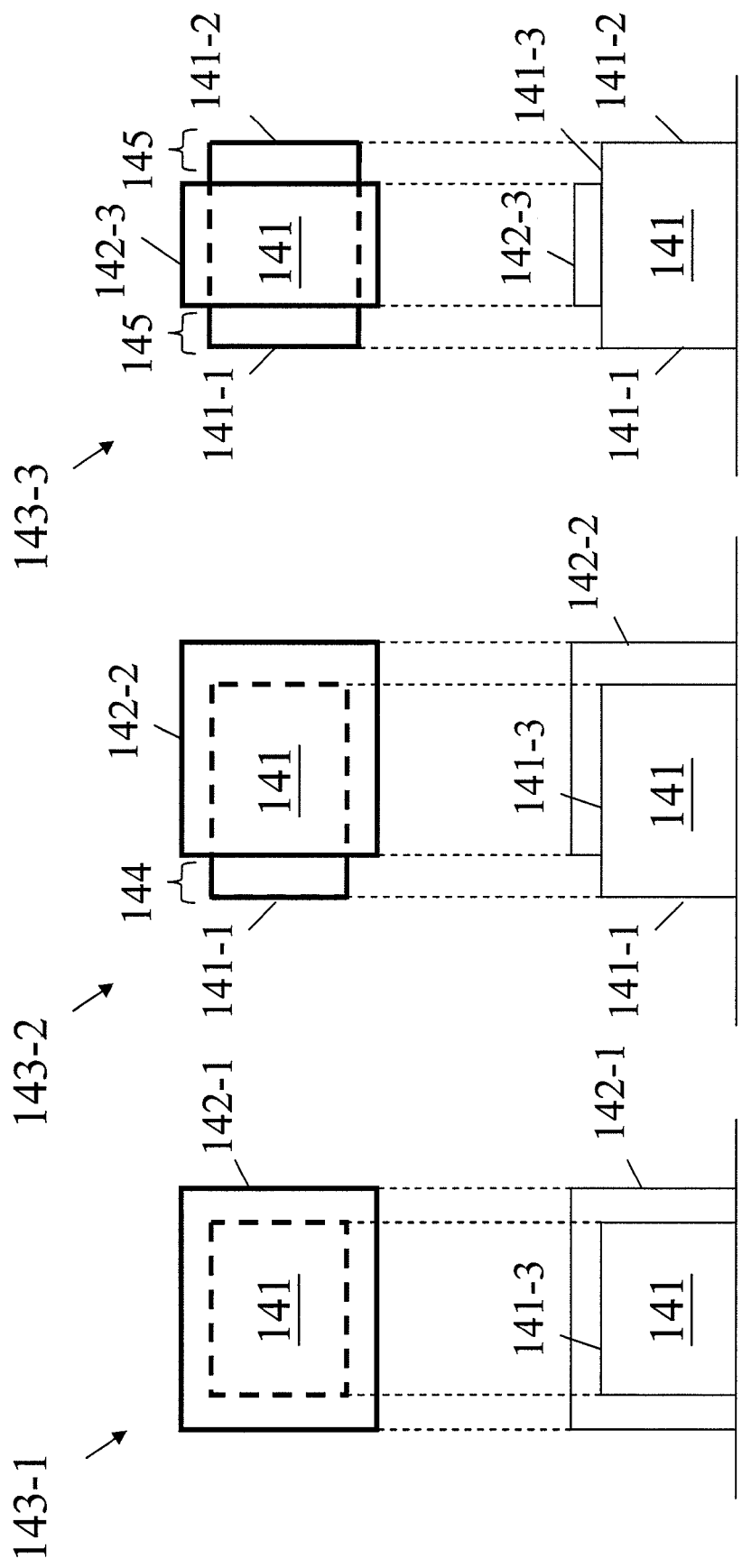

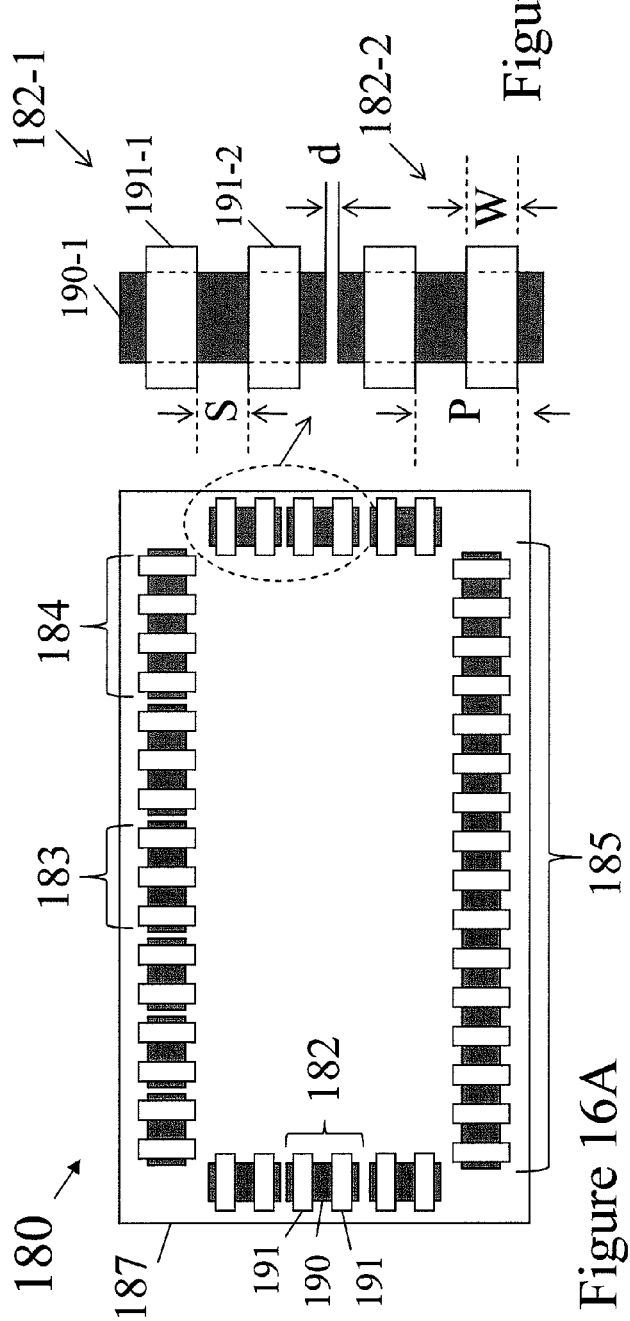
Figure 16A
Figure 16B
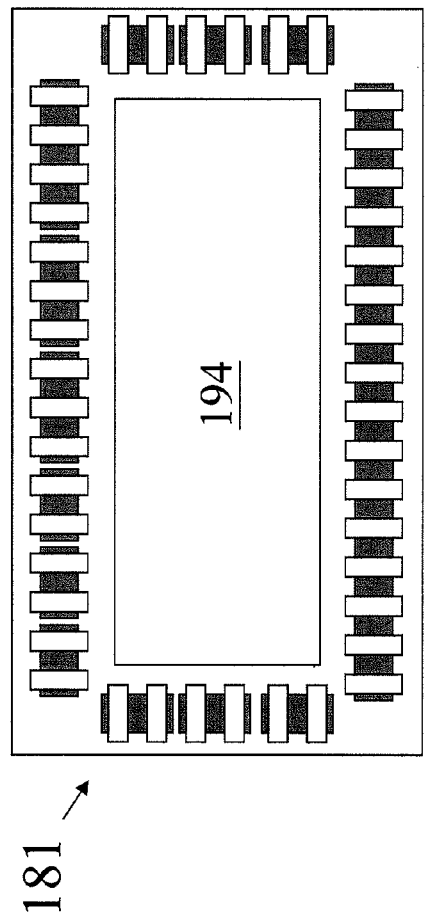
Figure 16C

ELECTRONIC ASSEMBLY HAVING A MULTILAYER ADHESIVE STRUCTURE

CROSS-REFERENCE TO RELATED APPLICATIONS

This application is a continuation-in-part of U.S. patent application Ser. No. 12/020,508, filed Jan. 25, 2008, now U.S. Pat. No. 7,960,830 which is a continuation-in-part of U.S. patent application Ser. No. 11/644,184, filed Dec. 22, 2006, now U.S. Pat. No. 7,348,271, which is a divisional of U.S. patent application Ser. No. 10/714,277, filed Nov. 14, 2003, now U.S. Pat. No. 7,154,176, the contents of all of which are hereby incorporated by reference in their entireties.

BACKGROUND OF THE INVENTION

The present invention generally relates to an electronic assembly and, more particularly, to an electronic assembly having a multilayer adhesive structure.

In the recent development of integrated circuit (IC) chip mounting technologies, an IC chip may be bonded to an electronic substrate by establishing electrical communication between conductive bumps built on the IC chip and bond pads provided on the electronic substrate. When such bonding technique is used, an anisotropic conductive film (ACF) may be provided between the IC chip and the electronic substrate such that electrically conductive particles embedded in the ACF provide such electrical communication.

Referring initially to FIGS. 1A-1C, a process for bonding a microelectronic structure 10 to an electronic substrate 20 is shown. The microelectronic structure 10 may be provided with multiple, electrically-conductive bumps 12 formed on a top surface for providing electrical communication to microelectronic circuits (not shown) in the microelectronic structure 10. Each of the conductive bumps 12 may be built on a bond pad 14 and a seed layer 16, and may be insulated by a dielectric layer 18. The electronic substrate 20 may be provided with multiple bond pads 22 formed on a top surface 24. The electronic substrate 20 may include but is limited to one of a printed circuit board (PCB), silicon (Si) substrate and glass substrate. An anisotropic conductive film (ACF) 30, which may include multiple, electrically-conductive particles 32 embedded in an electrically-insulating material 34, may be applied over the top surface 24 of the electronic substrate 20.

The microelectronic structure 10, the electronic substrate 20 and the ACF 30 may be placed in a heat-bonding equipment, where a suitable pressure may be applied to press the microelectronic structure 10 against the electronic substrate 20, resulting in an electronic assembly 40 as shown in FIG. 1C. Referring to FIG. 1C, electrical communication between the microelectronic structure 10 and the electronic substrate 20 may be established by electrically-conductive particles 32a, 32b and 32c, which provide electrical conductance between the conductive bumps 12 and the bond pads 22.

The bonding process using ACF may be cost efficient. However, it may be difficult to control the distribution of the electrically-conductive particles 32 when an ACF is prepared. As a result, referring to FIG. 1D, a number of the electrically-conductive particles 32d may cluster between adjacent conductive bumps 12 and thus cause undesirable short-circuiting therebetween, which may damage the normal circuit function. To address the issue, ACF films with a controllable pattern of distribution of electrically-conductive particles have been proposed. However, such ACF films may be too expensive to be used in general bonding processes.

BRIEF SUMMARY OF THE INVENTION

Examples of the present invention may provide an electronic device that comprises a substrate and a number of bump units over the substrate, wherein each of the bump units includes an electrically insulating bump-forming body extending in a first direction, and at least two conductive layers separated from each other on the electrically insulating bump-forming body, the at least two conductive layers extending in a second direction orthogonal to the first direction.

Some examples of the present invention may also provide an electronic device that comprises a substrate, a first row of bump units over the substrate, and a second row of bump units adjacent to the first row of bump units over the substrate, wherein each of the first and second rows of bump units includes an electrically insulating bump-forming body extending in a first direction, and at least two conductive layers separated from each other on the electrically insulating bump-forming body, the at least two conductive layers extending in a second direction orthogonal to the first direction, and wherein a first side of the first row of bump units and a second side of the second row of bump units are opposed to each other, and at least one of the first side and the second side is free from the conductive layers.

Examples of the present invention may also provide a method of forming electronic devices in a wafer-level process. The method comprises preparing a silicon wafer, forming a patterned insulating layer over the silicon wafer, wherein the patterned insulating layer includes a number of bump-forming layers extending in a first direction, forming a first patterned conductive layer on the patterned insulating layer, wherein the first patterned conductive layer includes a number of first conductive layers separated from each other and extending in a second direction orthogonal to the first direction, forming an adhesive layer over the first patterned conductive layer, and cutting the wafer into a number of electronic devices each including a portion of the bump-forming layers and a portion of the first conductive layers, wherein in each of the electronic devices at least two first conductive layers are formed on each of the bump-forming layers.

Examples of the present invention may further provide a method of forming electronic devices in a wafer-level process. The method comprises preparing a silicon wafer, forming a patterned insulating layer over the silicon wafer, wherein the patterned insulating layer includes a number of bump-forming layers, forming a first patterned conductive layer on the patterned insulating layer, wherein the first patterned conductive layer includes a number of first conductive layers separated from each other, forming an adhesive layer over the first patterned conductive layer, and cutting the wafer into a number of electronic devices each including a portion of the bump-forming layers and a portion of the first conductive layers, wherein each of the electronic devices includes one of the bump-forming layers and one of the first conductive layers formed on the one of the bump-forming layers.

BRIEF DESCRIPTION OF THE SEVERAL VIEWS OF THE DRAWINGS

The foregoing summary as well as the following detailed description of the preferred embodiments of the present invention will be better understood when read in conjunction with the appended drawings. For the purposes of illustrating the invention, there are shown in the drawings embodiments which are presently preferred. It is understood, however, that the invention is not limited to the precise arrangements and instrumentalities shown. In the drawings:

FIGS. 1A-1D are schematic cross-sectional views illustrating a conventional bonding process for mounting a microelectronic structure to an electronic substrate by using an anisotropic conductive film (ACF);

FIG. 4A is a cross-sectional view of still another exemplary conductive bump taken along lines 2A-2A of the microelectronic structure illustrated in FIG. 2;

FIG. 4B is a cross-sectional view of still another exemplary conductive bump taken along lines 2B-2B of the microelectronic structure illustrated in FIG. 2;

FIG. 5 is a schematic view of a microelectronic structure provided with multiple conductive bumps in accordance with another example of the present invention;

FIGS. 14B, 14C and 14D are schematic diagrams each showing a cross-sectional view and a top view of a bump in accordance with examples of the present invention;

FIG. 16A is a schematic top view of an electronic device in accordance with an example of the present invention;

FIG. 16B is an amplified view of bump units illustrated in FIG. 16A;

FIG. 16C is a schematic top view of an electronic device in accordance with another example of the present invention;

DETAILED DESCRIPTION OF THE INVENTION

Reference will now be made in detail to the present examples of the invention illustrated in the accompanying drawings. Wherever possible, the same reference numbers will be used throughout the drawings to refer to the same or like portions. It should be noted that the drawings are in greatly simplified form and are not to precise scale. In reference to the disclosure herein, for purposes of convenience and clarity only, directional terms such as inner, outer, upper, lower, inward and outward, are used with respect to the accompanying drawings. Such directional terms used in conjunction with the following description of the drawings should not be construed to limit the scope of the invention in any manner not explicitly set forth in the appended claims.

Figure 2:
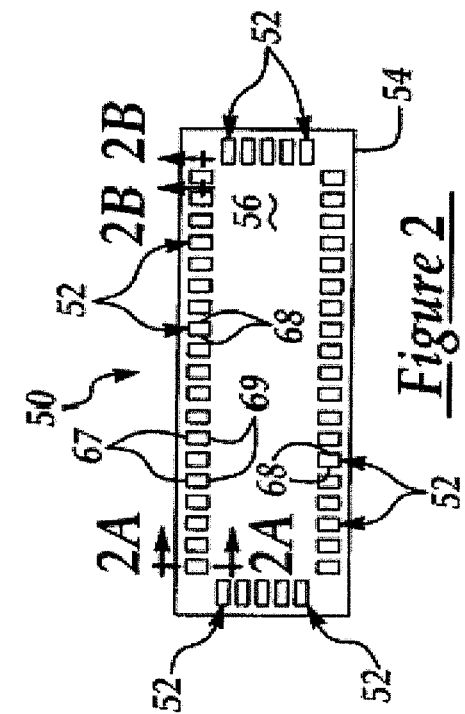
FIG. 2 is a schematic view of a microelectronic structure provided with multiple conductive bumps in accordance with an example of the present invention.
Figure 2A:
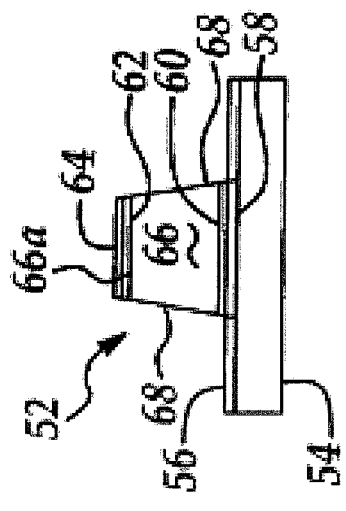
FIG. 2A is a cross-sectional view of an exemplary conductive bump taken along lines 2A-2A of the microelectronic structure illustrated in FIG. 2.
Figure 2B:
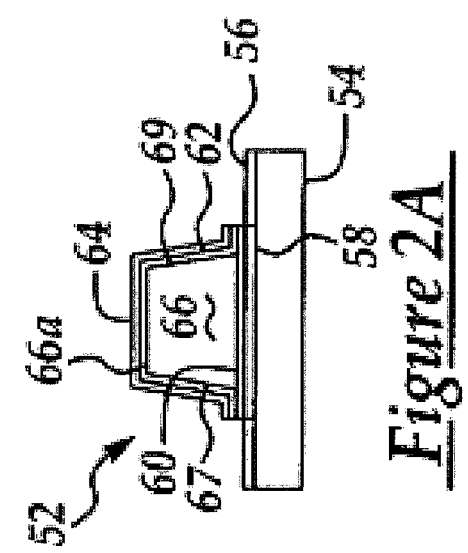
FIG. 2B is a cross-sectional view of an exemplary conductive bump taken along lines 2B-2B of the microelectronic structure illustrated in FIG. 2.

FIG. 2 is a schematic view of a microelectronic structure 50 provided with multiple conductive bumps 52 in accordance with an example of the present invention. FIG. 2A is a cross-sectional view of an exemplary conductive bump taken along lines 2A-2A of the microelectronic structure 50 illustrated in FIG. 2, and FIG. 2B is a cross-sectional view of an exemplary conductive bump taken along lines 2B-2B of the microelectronic structure illustrated in FIG. 2. Referring to FIG. 2, an integrated circuit (IC) chip or microelectronic device 50 may include a substrate 54 and multiple conductive bumps 52 provided on a surface of the substrate 54. The conductive bumps 52 may be arranged in a pattern along the sides of the substrate 54. Each of the conductive bumps 52 may be electrically coupled with an IC device (not shown) fabricated on the substrate 54.

Referring to FIGS. 2A and 2B, a passivation layer 56 may be formed over the substrate 54. A metal bond pad 58 may be provided in electrical contact with the IC device on the substrate 54. Each of the conductive bumps 52 may include an adhesive layer 62, an under-bump metal (UBM) 60 and a bump-forming layer 66. The UBM 60 may be formed on the bond pad 58 by, for example, a deposition process such as a chemical vapor deposition (CVD) process or physical vapor deposition (PVD) process. The bump-forming layer 66, which may include polyimide (PI) or other electrically insulating material, may be formed by, for example, depositing an insulating layer over the UBMs 60 and then patterning and etching the insulating layer to define the bump-forming layer 66 for the conductive bump 52s. As shown in FIGS. 2 and 2A, each of the conductive bumps 52 may include an outer wall 67 that faces outwardly from the chip 50 and an inner wall 69 that faces the center of the chip 50. As shown in FIGS. 2 and 2B, each of the conductive bumps 52 may further include sidewalls 68 that are positioned adjacent to the sidewalls 68 of the neighboring conductive bumps 52 on the chip 50.

An adhesion layer 62 may be deposited over the bump-forming layer 66, and then a metal conductive layer 64 may be deposited over the adhesion layer 62. The conductive layer 64 may include one or more of electrically conductive metal such as Au, Ag, Pt, Pd, Al, Cu, Sn and alloys thereof. The adhesion layer 62 may facilitate adhesion between the conductive layer 64 and the underlying bump-forming layer 66. In the example shown in FIG. 2A, the adhesion layer 62 and the conductive layer 64 of one conductive bump 52 may cover the outer wall 67, the inner wall 69 and an upper surface 66a of the bump-forming layer 66. As shown in FIG. 2B, both of the sidewalls 68 of the bump-forming layer 66 of the one conductive bump 52 may remain exposed and uncovered by the adhesion layer 62 and the conductive layer 64. The adhesion layer 62 and the conductive layer 64 may be etched from the sidewalls 68 of the one conductive bump 52. Accordingly, short-circuiting between the sidewalls 68 of adjacent conductive bumps 52 in an electronic assembly (such as the electronic assembly 88 illustrated in FIG. 10) may be prevented.

Figure 3A:
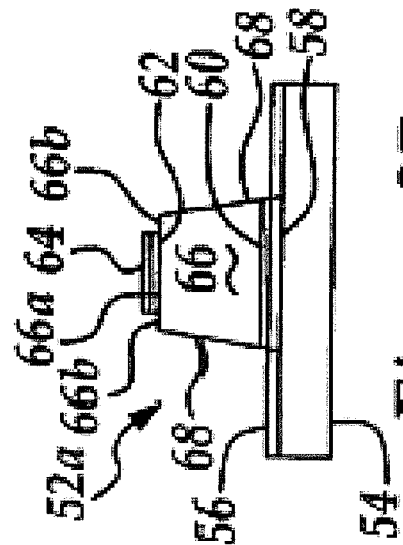
FIG. 3A is a cross-sectional view of another exemplary conductive bump taken along lines 2A-2A of the microelectronic structure illustrated in FIG. 2.
Figure 3B:
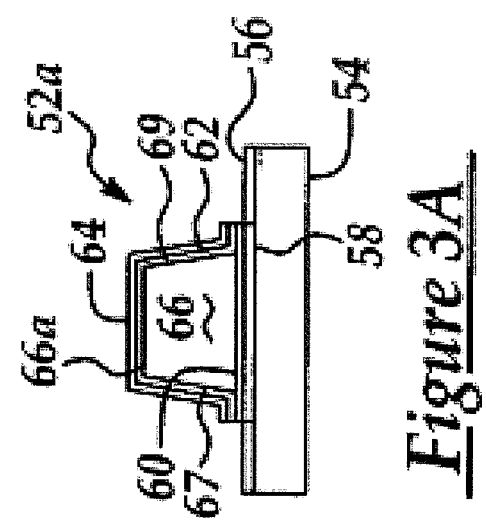
FIG. 3B is a cross-sectional view of another exemplary conductive bump taken along lines 2B-2B of the microelectronic structure illustrated in FIG. 2.

FIG. 3A is a cross-sectional view of another exemplary conductive bump taken along lines 2A-2A of the microelectronic structure 50 illustrated in FIG. 2, and FIG. 3B is a cross-sectional view of another exemplary conductive bump taken along lines 2B-2B of the microelectronic structure 50 illustrated in FIG. 2. Referring to FIG. 3A, the conductive layer 64 and the adhesion layer 62 may cover the upper surface 66a, outer wall 67 and inner wall 69 of a conductive bump 52a. Referring to FIG. 3B, the sidewalls 68 may be free from the conductive layer 64 and the adhesion layer 62 and thus may be exposed. Furthermore, the conductive layer 64 and adhesion layer 62 on the upper surface 66a may be etched to define at least one shoulder 66b, which is a region of the upper surface 66a uncovered by the conductive layer 64 and the adhesion layer 62.

FIG. 4A is a cross-sectional view of still another exemplary conductive bump taken along lines 2A-2A of the microelectronic structure 50 illustrated in FIG. 2, and FIG. 4B is a cross-sectional view of still another exemplary conductive bump taken along lines 2B-2B of the microelectronic structure 50 illustrated in FIG. 2. Referring to FIG. 4A, the conductive layer 64 and the adhesion layer 62 may cover the upper surface 66a, outer wall 67 and inner wall 69 of a conductive bump 52b. Referring to FIG. 4B, the conductive bump 52b may include an exposed sidewall 68 free from the conductive layer 64 and the adhesion layer 62, and a covered sidewall 68 on which the conductive layer 64 and the adhesion layer 62 are provided. A shoulder 66b may be provided at the upper surface 66a of the conductive bump 52b.

Figure 5B:
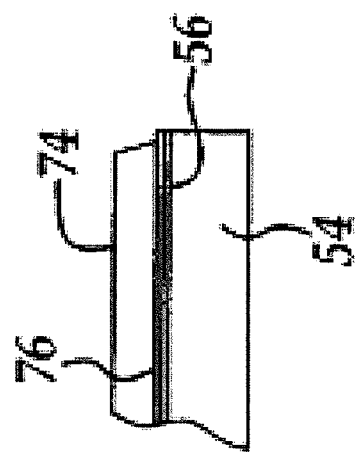
FIG. 5B is a cross-sectional view of another exemplary conductive bump taken along lines 5A-5A of the microelectronic structure illustrated in FIG. 5.
Figure 5A:
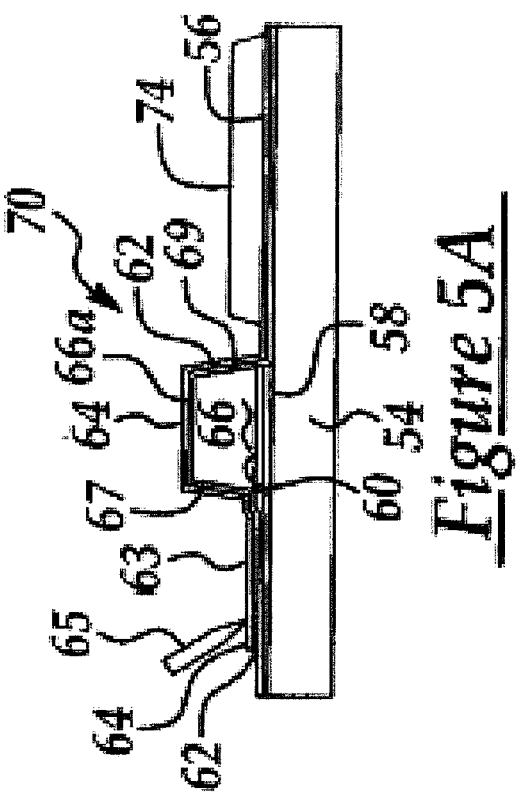
FIG. 5A is a cross-sectional view of an exemplary conductive bump taken along lines 5A-5A of the microelectronic structure illustrated in FIG. 5.

FIG. 5 is a schematic view of a microelectronic structure 70 provided with multiple conductive bumps 72 in accordance with another example of the present invention. FIG. 5A is a cross-sectional view of an exemplary conductive bump taken along lines 5A-5A of the microelectronic structure 70 illustrated in FIG. 5, and FIG. 5B is a cross-sectional view of another exemplary conductive bump taken along lines 5A-5A of the microelectronic structure 70 illustrated in FIG. 5. The microelectronic structure 70 may be similar to the microelectronic structure 50 described and illustrated with reference to FIG. 2 except that, for example, a protection layer 74 may be added. Referring to FIG. 5, multiple conductive bumps 72 may be provided on a surface of a substrate 54 and may be arranged in a pattern along the sides of the substrate 54. The protection layer 74, which may be provided at a center region of the substrate 54, may protect the passivation layer 56 from damage such as scratch.

Referring to FIG. 5A, an adhesion layer 62 and a conductive layer 64 may cover the outer wall 67 and the inner wall 69 of the conductive bump 72. Moreover, one or more of the sidewalls, similar to the sidewalls 68 shown in FIG. 4B, of each of the conductive bumps 72 may be exposed. The adhesion layer 62 and the conductive layer 64 may extend over the substrate 54 toward the protection layer 74. The portion of the adhesion layer 62 and the conductive layer 64 extending on the substrate 54 may serve as a test probe pad 63 for electrical contact with a test probe 65 in testing the microelectronic structure 70.

Referring to FIG. 5B, a metal shielding layer 76 may be provided between the passivation layer 56 and the protection layer 74.

Figure 6:
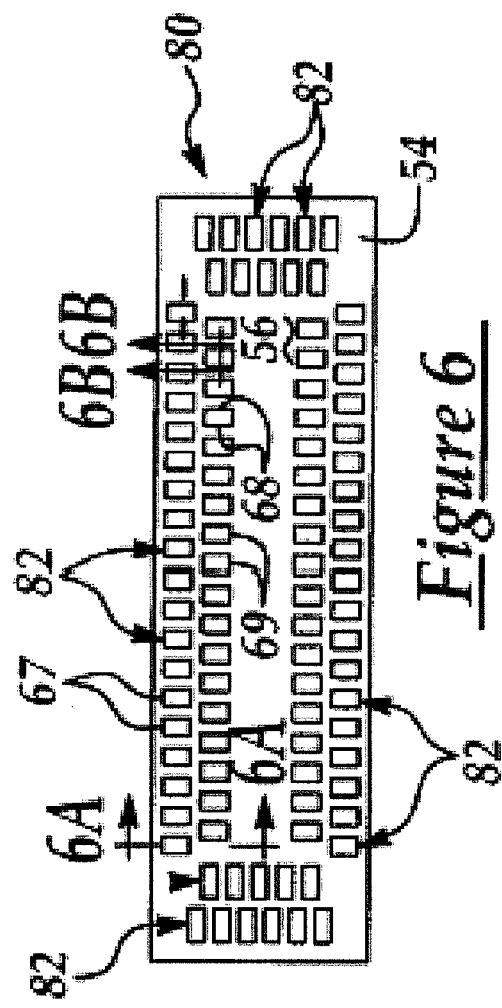
FIG. 6 is a schematic view of a microelectronic structure provided with multiple conductive bumps in accordance with still another example of the present invention.
Figure 6A:
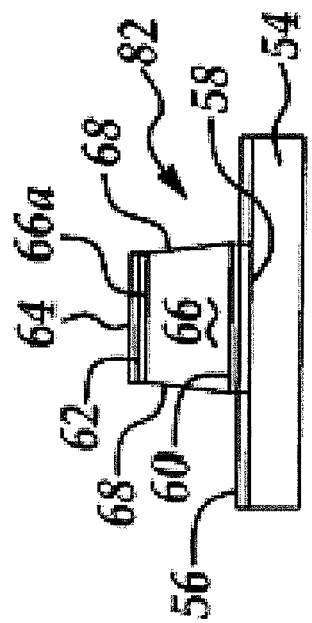
FIG. 6A is a cross-sectional view of an exemplary conductive bump taken along lines 6A-6A of the microelectronic structure illustrated in FIG. 6.
Figure 6B:
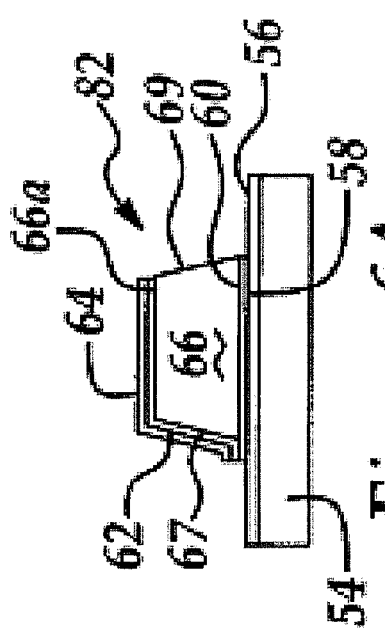
FIG. 6B is a cross-sectional view of an exemplary conductive bump taken along lines 6B-6B of the microelectronic structure illustrated in FIG. 6.

FIG. 6 is a schematic view of a microelectronic structure 80 provided with multiple conductive bumps 82 in accordance with still another example of the present invention. FIG. 6A is a cross-sectional view of an exemplary conductive bump taken along lines 6A-6A of the microelectronic structure 80 illustrated in FIG. 6, and FIG. 6B is a cross-sectional view of an exemplary conductive bump taken along lines 6B-6B of the microelectronic structure 80 illustrated in FIG. 6. Referring to FIG. 6, a number of conductive bumps 82 may be provided on the substrate 54 in rows in several sections. In the present example, a first row of conductive bumps 82 may be staggered with respect to a second row of conductive bumps 82 in the same section.

Referring to FIG. 6A, the outer wall 67 and the upper surface 66a of each of the conductive bumps 82 may be covered by the adhesion layer 62 and the conductive layer 64, while the inner wall 69 of each of the conductive bumps 82 may be exposed and uncovered by the adhesion layer 62 and conductive layer 64. Referring to FIG. 6B, the sidewalls 68 of each of the conductive bumps 82 may be exposed and uncovered by the adhesion layer 62 and conductive layer 64.

Figure 7A:
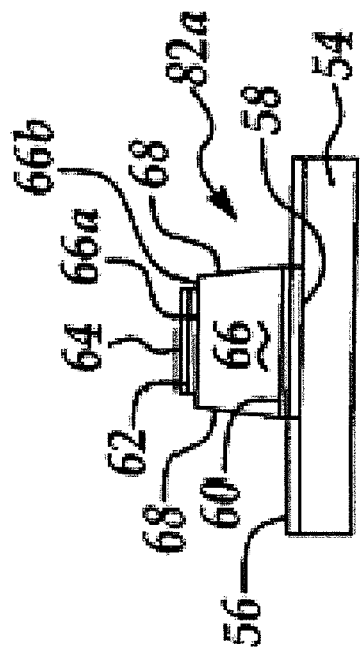
FIG. 7A is a cross-sectional view of another exemplary conductive bump taken along lines 6A-6A of the microelectronic structure illustrated in FIG. 6.
Figure 7B:
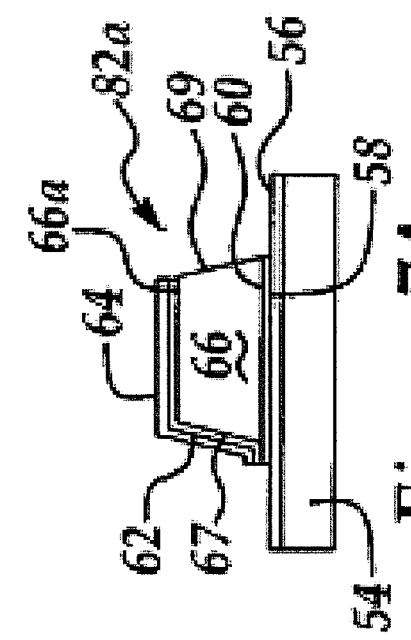
FIG. 7B is a cross-sectional view of another exemplary conductive bump taken along lines 6B-6B of the microelectronic structure illustrated in FIG. 6.

FIG. 7A is a cross-sectional view of another exemplary conductive bump taken along lines 6A-6A of the microelectronic structure 80 illustrated in FIG. 6, and FIG. 7B is a cross-sectional view of another exemplary conductive bump taken along lines 6B-6B of the microelectronic structure 80 illustrated in FIG. 6. Referring to FIG. 7A, the adhesion layer 62 and the conductive layer 64 may cover the upper surface 66a and the outer wall 67 of a conductive bumps 82a, while the inner wall 69 may be exposed. Referring to FIG. 7B, the conductive bumps 82a may include at least one shoulder 66b at the upper surface 66a.

Figure 8A:
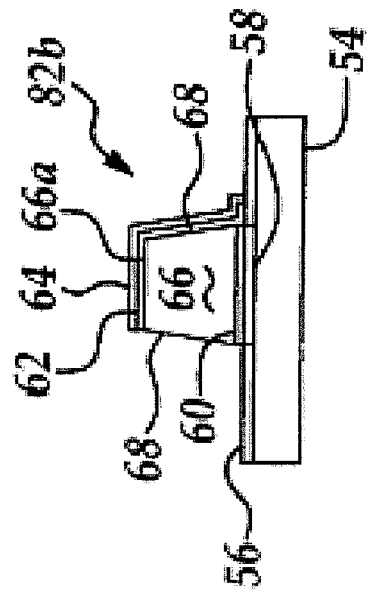
FIG. 8A is a cross-sectional view of still another exemplary conductive bump taken along lines 6A-6A of the microelectronic structure illustrated in FIG. 6.
Figure 8B:
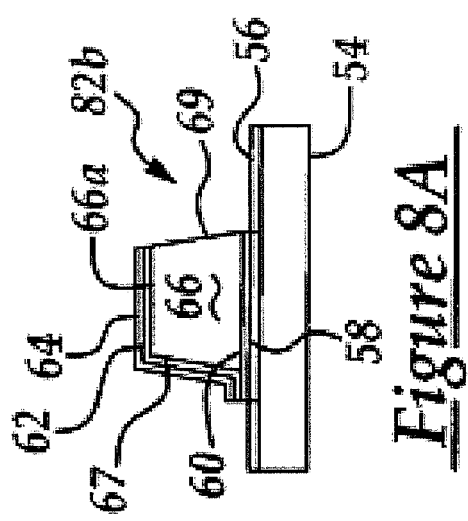
FIG. 8B is a cross-sectional view of still another exemplary conductive bump taken along lines 6B-6B of the microelectronic structure illustrated in FIG. 6.

FIG. 8A is a cross-sectional view of still another exemplary conductive bump taken along lines 6A-6A of the microelectronic structure 80 illustrated in FIG. 6, and FIG. 8B is a cross-sectional view of still another exemplary conductive bump taken along lines 6B-6B of the microelectronic structure 80 illustrated in FIG. 6. Referring to FIG. 8A, the upper surface 66a and outer wall 67 of a conductive bump 82b may be covered by the adhesion layer 62 and the conductive layer 64, while the inner wall 69 may be exposed. Referring to FIG. 8B, one sidewall 68 may be covered by the adhesion layer 62 and the conductive layer 64, and the other sidewall 68 may be exposed.

Figure 9:
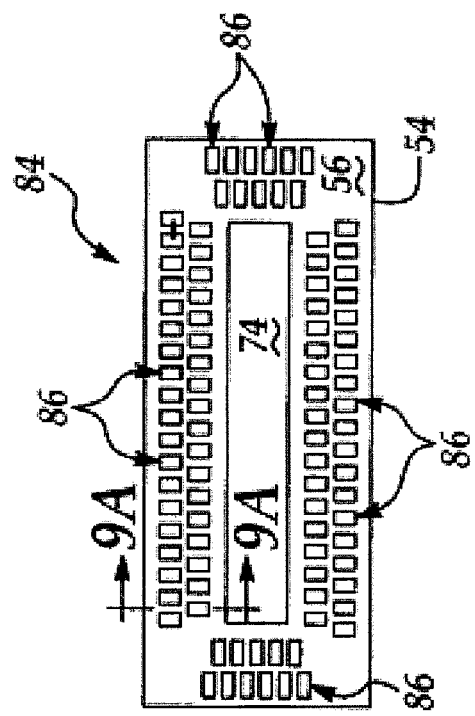
FIG. 9 is a schematic view of a microelectronic structure provided with multiple conductive bumps in accordance with yet another example of the present invention.
Figure 9A:
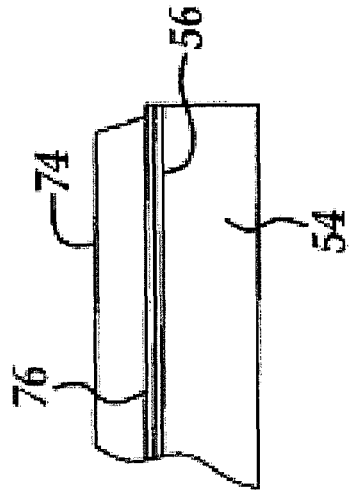
FIG. 9A is a cross-sectional view of an exemplary conductive bump taken along lines 9A-9A of the microelectronic structure illustrated in FIG. 9.
Figure 9B:
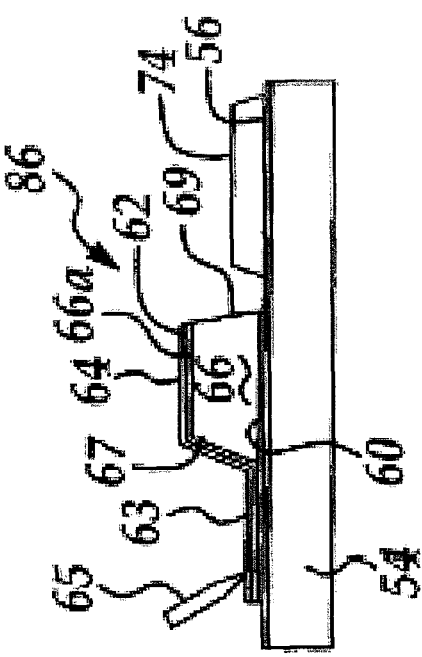
FIG. 9B is a cross-sectional view of another exemplary conductive bump taken along lines 9A-9A of the microelectronic structure illustrated in FIG. 9.

FIG. 9 is a schematic view of a microelectronic structure 84 provided with multiple conductive bumps 86 in accordance with yet another example of the present invention. Furthermore, FIG. 9A is a cross-sectional view of an exemplary conductive bump taken along lines 9A-9A of the microelectronic structure 84 illustrated in FIG. 9, and FIG. 9B is a cross-sectional view of another exemplary conductive bump taken along lines 9A-9A of the microelectronic structure 84 illustrated in FIG. 9. The microelectronic structure 84 may be similar to the microelectronic structure 80 described and illustrated with reference to FIG. 6 except that, for example, a protection layer 74 may be added. Referring to FIG. 9, multiple conductive bumps 86 may be provided on the substrate 54 in rows and arranged near the sides of the substrate 54. The protection layer 74 may protect the passivation layer 56 from damage.

Referring to FIG. 9A, the adhesion layer 62 and the conductive layer 64 may cover the outer wall 67 and the upper surface 66a of each of the conductive bumps 86, while the inner wall 69 of each of the conductive bumps 86 and one or more of the sidewalls, similar to the sidewalls 69 illustrated in FIG. 8B, of each of the conductive bumps 86 may be exposed. The adhesion layer 62 and the conductive layer 64 may extend over the substrate 54. The portion of the adhesion layer 62 and the conductive layer 64 extending on the substrate 54 may serve as a test probe pad 63 for electrical contact with a test probe 65 in testing the microelectronic structure 84.

Referring to FIG. 9B, a metal shielding layer 76 may be provided between the passivation layer 56 and the protection layer 74.

Figure 10:
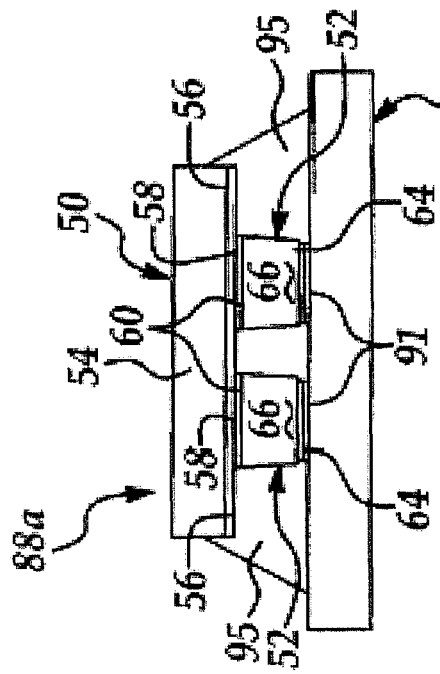
FIG. 10 is a cross-sectional view of an electronic assembly in accordance with an example of the present invention.

FIG. 10 is a cross-sectional view of an electronic assembly 88 in accordance with an example of the present invention. Referring to FIG. 10, the electronic assembly 88, which may take the form of but is not limited to a flip-chip assembly, may include a microelectronic structure similar to the microelectronic structure 50 described and illustrated with reference to FIG. 2, a substrate 90 on which multiple bond pads 91 are provided, and an anisotropic conductive film (ACF) 92 electrically coupling the microelectronic structure 50 and the substrate 90. Specifically, electrical connection between one of the conductive bumps 52 of the microelectronic structure 50 and one of the bond pads 91 of the substrate 90 may be established by one or more of conductive particles 94 in the ACF 92. The substrate 90 in one example may include one of a printed circuit board (PCB), Si substrate and glass substrate. Because the sidewalls 68 of each of the conductive bumps 52 may exhibit insulated for lack of a conductive layer, for example, the conductive layer 64 shown in FIG. 2B, the conductive particles 94 between adjacent conductive bumps 52, even clustered, may not cause short-circuiting of the adjacent conductive bumps 52.

The electronic assembly 88 in implementation may serve as a chip-on-glass (COG) structure, wherein a semiconductor chip may be fabricated on a glass substrate. In one example, each of the conductive bumps 52 may have a height of approximately 10 micrometers (μm), and each of the bond pads 91 may have a height of approximately 0.2 μm.

Figure 11:
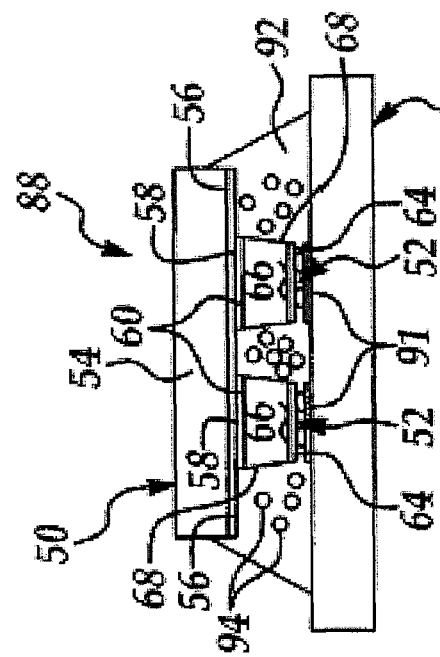
FIG. 11 is a cross-sectional view of an electronic assembly in accordance with another example of the present invention.

FIG. 11 is a cross-sectional view of an electronic assembly 88a in accordance with another example of the present invention. Referring to FIG. 11, the electronic assembly 88a may be similar to the electronic assembly 88 described and illustrated with reference to FIG. 10 except that, for example, a non-conductive film (NCF) 95 replaces the ACF 92. Electrical connection between one of the conductive bumps 52 of the microelectronic structure 50 and one of the bond pads 91 of the substrate 90 may be established by the conductive layer 64 of each of the conductive bumps 52.

Figure 12B:
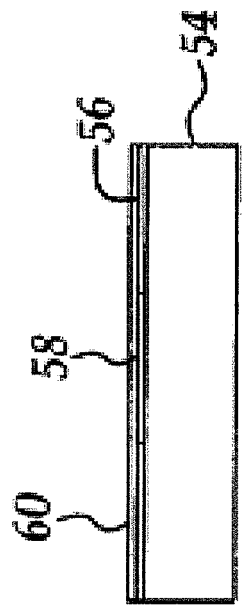
FIGS. 12A-12I are cross-sectional views illustrating a method of forming a conductive bump on an IC chip substrate in accordance with an example of the present invention.
Figure 12D:
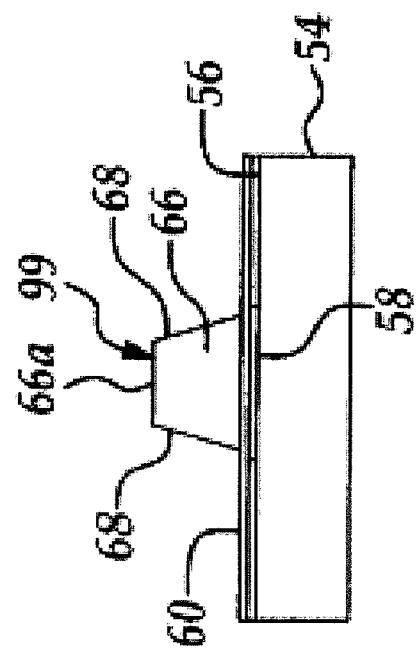
Figure 12A:
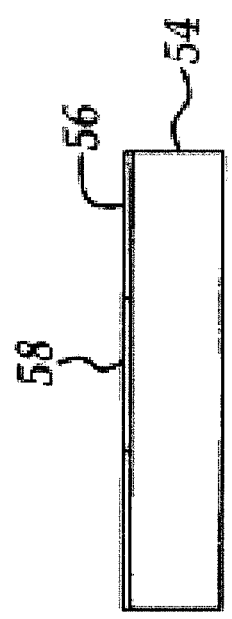

FIGS. 12A-12I are cross-sectional views illustrating a method of forming a conductive bump 52a on an IC chip substrate 54 in accordance with an example of the present invention. Referring to FIG. 12A, a passivation layer 56 may be formed over the substrate 54. The passivation layer 56 may then be patterned and etched to facilitate subsequent formation of a metal bond pad 58 in the patterned passivation layer. The bond pad 58 may serve as an electrical contact for an IC device (not shown) on the substrate 54.

Referring to FIG. 12B, a layer of under-bump metal (UBM) 60 may be formed on the passivation layer 56 and the bond pad 58 by, for example, a CVD or PVD process. The UBM 60 may serve as an adhesion layer for the conductive bump 52a to be formed thereon.

Figure 12C:
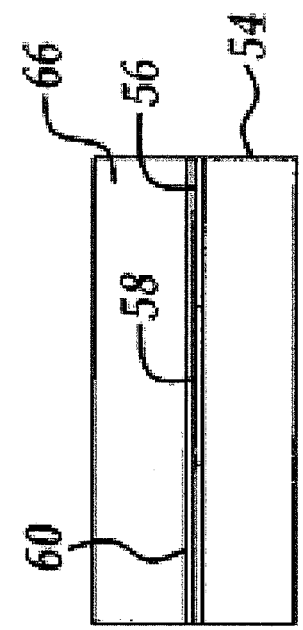

Referring to FIG. 12C, a bump-forming layer 66, which may include but is not limited to a non-conductive material such as polyimide (PI), may be formed over the UBM 60 by, for example, a spin-coating process or other suitable processes. The bump-forming layer 66 may serve as a supporting structure for the conductive bump 52a.

Referring to FIG. 12D, the bump-forming layer 66 may then be patterned and etched to form a bump structure 99 over the bond pad 58. The bump structure 99 thus formed may include an upper surface 66a and sidewalls 68.

Figure 12E:
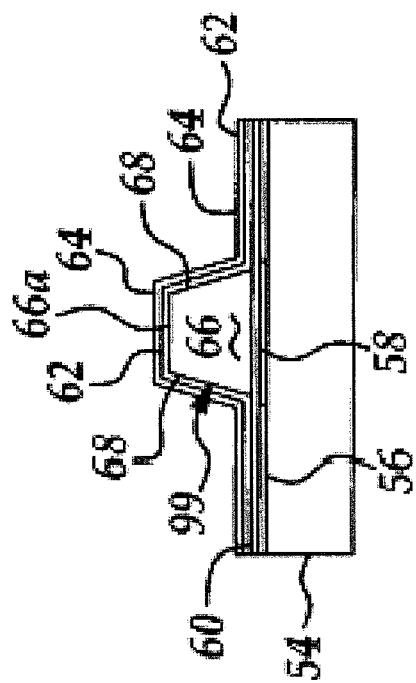
Figure 12F:
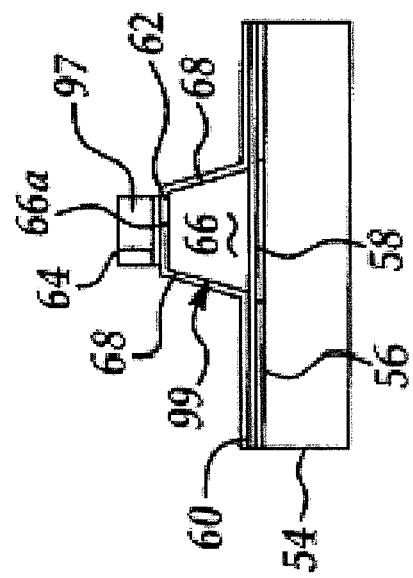

Referring to FIG. 12E, an adhesion layer 62 may be formed over the upper surface 66a and sidewalls 68 of the bump structure 99. Next, referring to FIG. 12F, a conductive layer 64 may be formed over the adhesion layer 62. The adhesion layer 62 and the conductive layer 64 in one example may be formed by a sputtering process or other suitable processes.

Figure 12G:
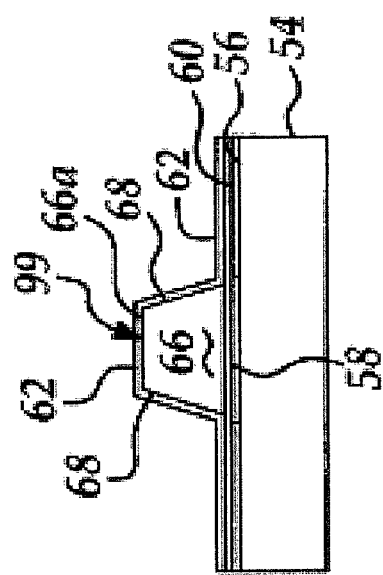

Referring to FIG. 12G, a patterned photoresist layer 97 may be formed on the conductive layer 64 over the upper surface 66a of the bump structure 99. The patterned photoresist layer 97 may expose portions of the conductive layer 64 and adhesion layer 62 corresponding to the sidewalls 68.

Figure 12H:
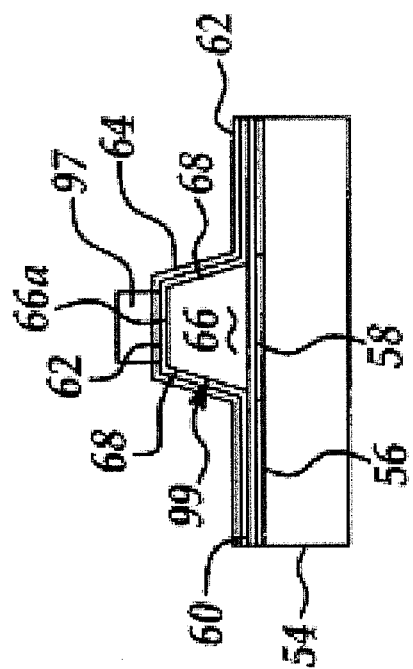
Figure 12I:
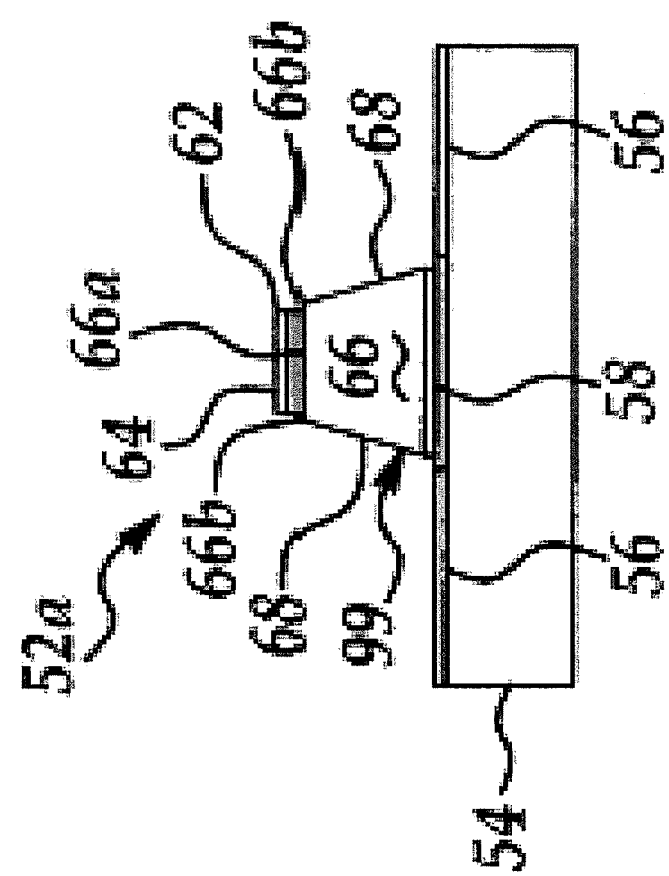

Referring to FIG. 12H, the portions of the conductive layer 64 and the adhesion layer 62 not covered by the photoresist 67 may be etched from the sidewalls 68 of the bump structure 99.

The patterned photoresist layer 97 may then be stripped. Consequently, referring to FIG. 12I, the conductive bump 52a may be formed, which includes the adhesion layer 62 and conductive layer 64 on the upper surface 66a, and the exposed, insulating sidewalls 68 uncovered by the adhesion layer 62 and conductive layer 64.

Referring back to FIG. 12G, in the present example, the patterned photoresist layer 97 may be narrower in width than the upper surface 66a of the conductive bump 52a. As a result, at least one shoulder 66b may be defined. In another example, however, the patterned photoresist layer 97 may cover the entire area of the upper surface 66a, resulting in a structure free of such shoulder 66b.

Figure 13A:
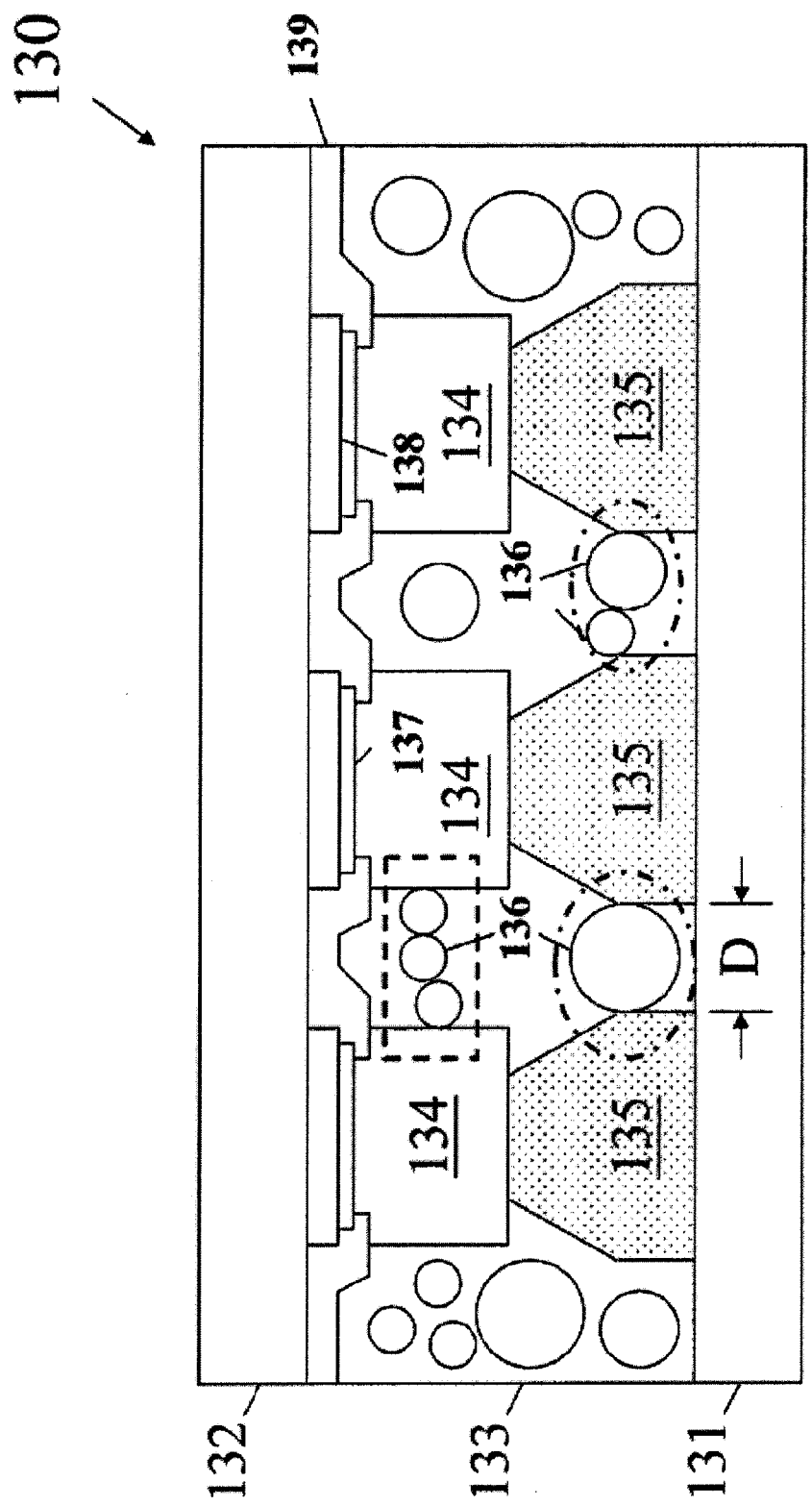
FIG. 13A is a schematic diagram illustrating short-circuiting issues with an electronic assembly.

FIG. 13A is a schematic diagram illustrating short-circuiting issues with an electronic assembly 130. Referring to FIG. 13A, the electronic assembly 130 may include a first substrate 131 on which metal bonds 135 may be provided, a second substrate 132 on which metal bumps 134 may be provided, and an ACF film 133 between the first substrate 131 and the second substrate 132 to facilitate electrical coupling of the metal bonds 135 and the metal bumps 134. The first substrate 131 may include a flexible substrate such as a polyimide (PI) substrate, while the second substrate 132 may include one of a glass substrate, PCB and Si substrate. Each of the metal bumps 134 such as gold bumps may be formed on a seed layer 137, which in turn may be formed on a pad 138. Furthermore, the metal bumps 134 may be electrically isolated from one another by an insulating layer 139.

The electronic assembly 130 in implementation may serve as a chip-on-film (COF) structure, wherein a semiconductor chip may be fabricated on a flexible substrate. A COF structure may be suitable for the mounting of semiconductor chips in apparatuses which are required to be light, thin and small, such as the mounting of a liquid crystal driver chip. Unlike the electronic assembly 88, which may serve as a COG structure as previously discussed with reference to FIG. 10, the electronic assembly 130 may have taller bonds. For example, each of the metal bonds 135 on the flexible substrate 131 may have a height of approximately 2 to 15 µm, which may be equal to that of the bumps 134. Furthermore, with the increasing interest in compact, light-weight and low-profile electronic products, the devices and components thereof are also manufactured with minimum feature size so as to meet the requirements for resolution. For example, the bond pitch "D" between adjacent metal bonds 135 may be approximately 5 µm or less.

Figure 1D:
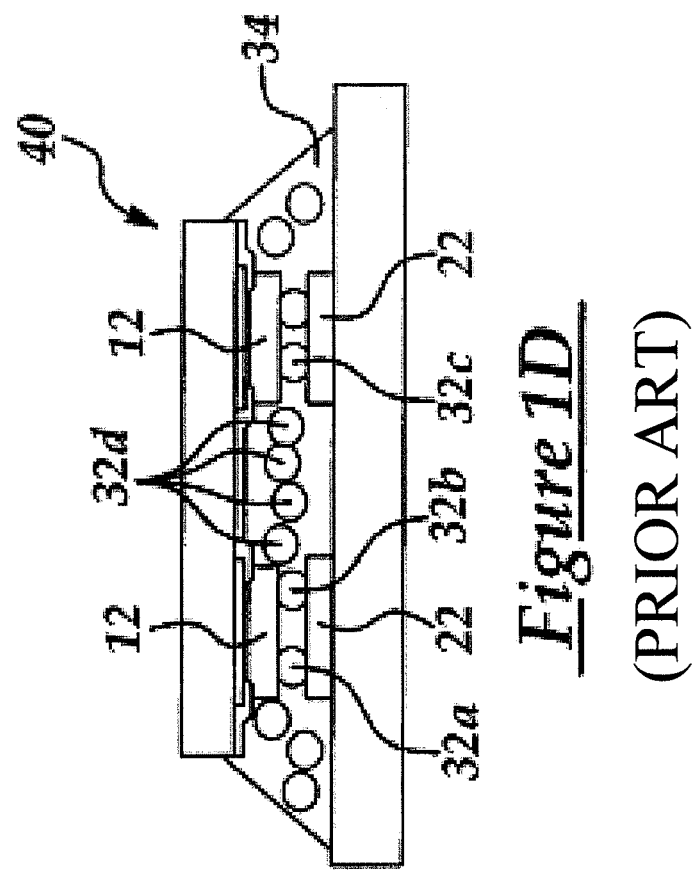

With the metal bumps 134 formed on the second substrate 132, a first short-circuiting issue, which has been discussed previously with reference to FIG. 1D, may occur between adjacent metal bumps 134, as indicated by a dotted rectangular box. Furthermore, with the taller bonds 135 and finer bond pitch "D", a second short-circuiting issue due to conductive particles 136 in the ACF film 133 may occur between adjacent metal bonds 135, as indicated by dotted circles.

Figure 13B:
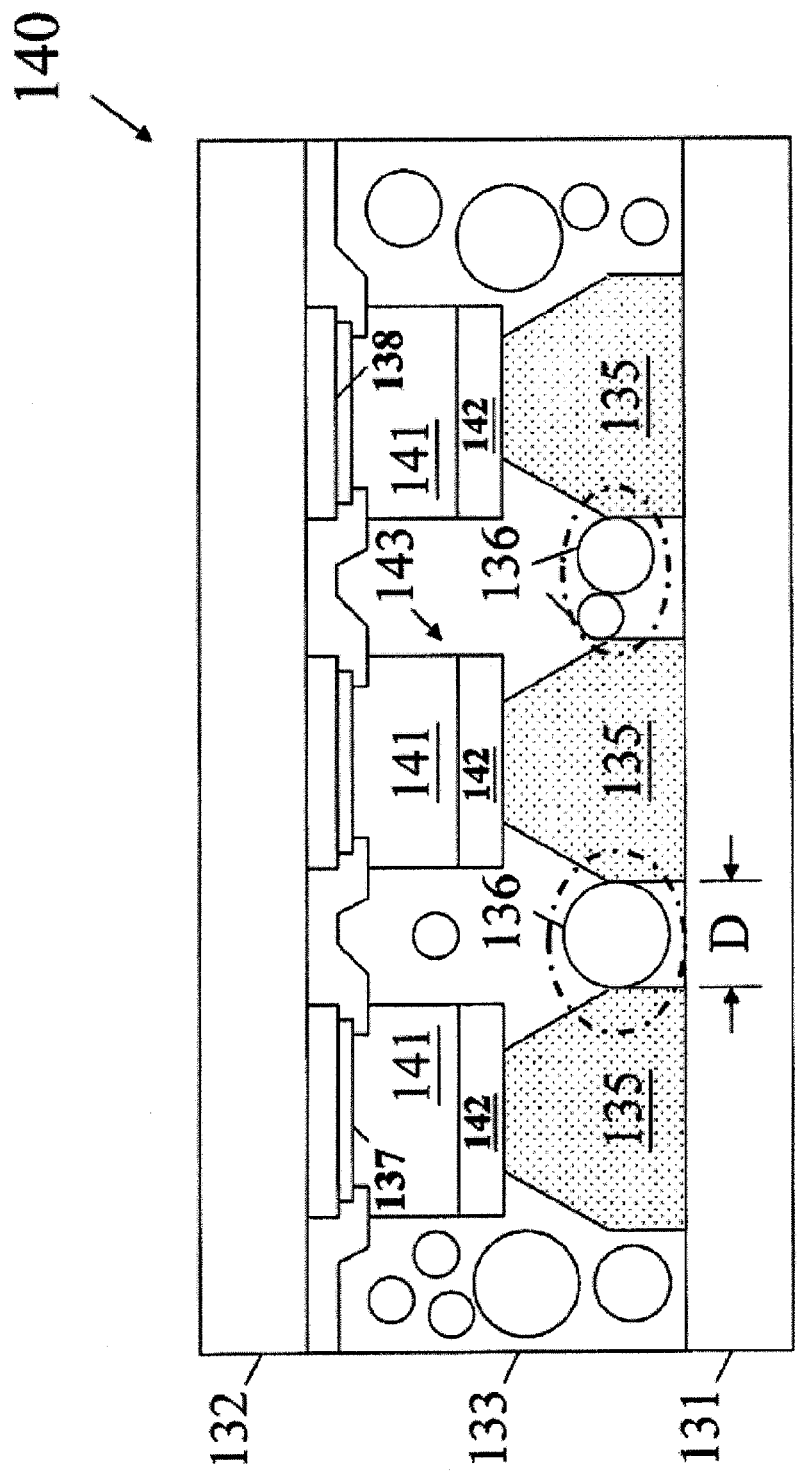
FIG. 13B is a schematic diagram illustrating short-circuiting issues with another electronic assembly.

FIG. 13B is a schematic diagram illustrating short-circuiting issues with another electronic assembly 140. Referring to FIG. 13B, the electronic assembly 140 may be similar to the electronic assembly 130 described and illustrated with reference to FIG. 13A except that, for example, bumps 143 may replace the bumps 134. Each of the bumps 143, which may be similar to the conductive bumps 52, 72, 82 and 86 respectively shown in FIGS. 2, 5, 6 and 9, may include an insulating or polymeric body 141 and a conductive portion 142. With the insulating body 141, the first short-circuiting issue may be prevented. However, the second short-circuiting issue due to the taller bonds 135 and finer pitch "D" can still occur.

Figure 14A:
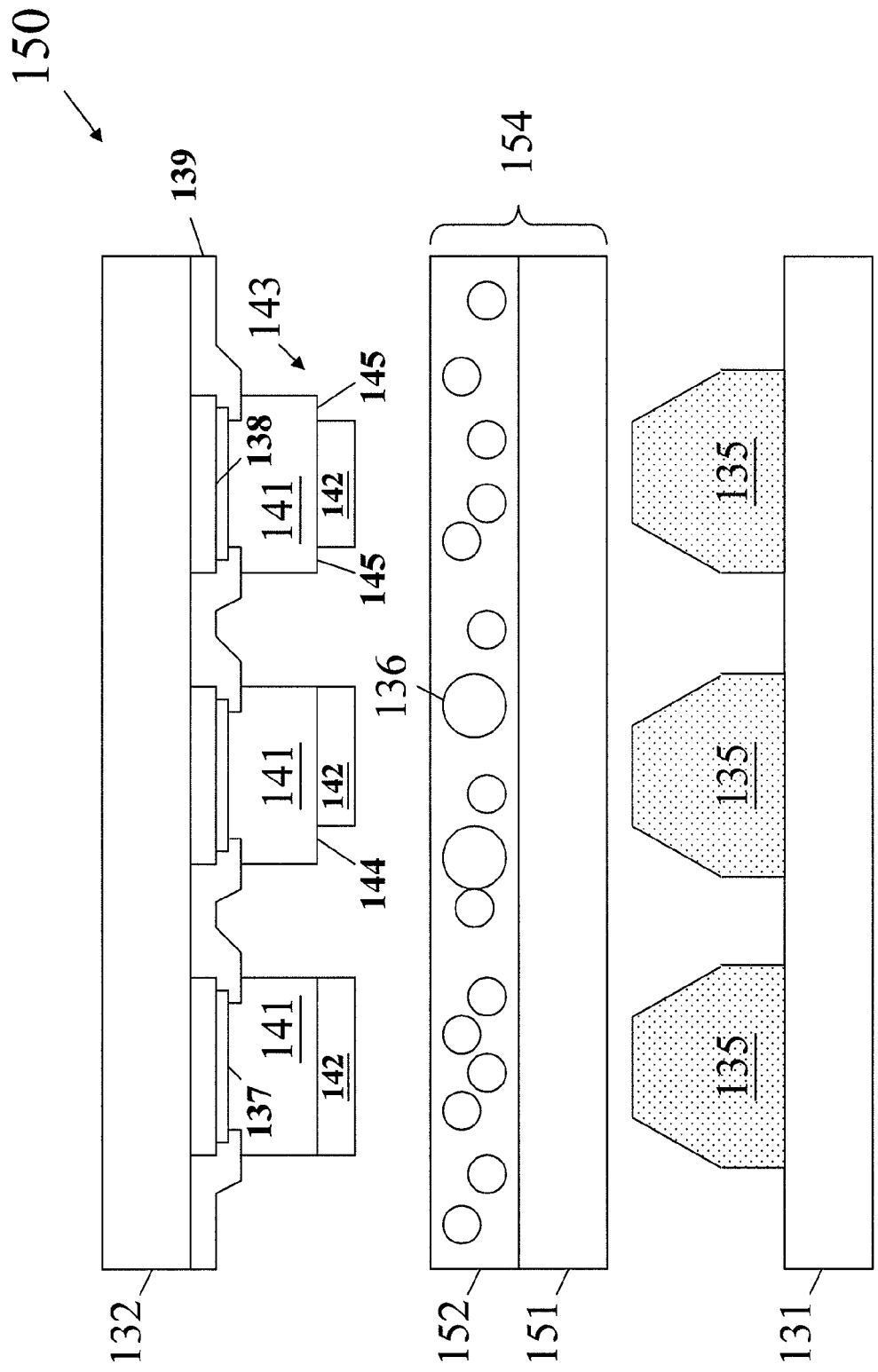
FIG. 14A is a schematic diagram of an exemplary electronic assembly before assembled.

FIG. 14A is a schematic diagram of an exemplary electronic assembly 150 before assembled. Referring to FIG. 14A, the electronic assembly 150 may be similar to the electronic assembly 140 described and illustrated with reference to FIG. 13B except that, for example, an anisotropic conductive adhesive (ACA) film 154 may replace the ACF film 133. Moreover, one or more of the bumps 143 may include a first shoulder 144 to facilitate electrical isolation between conductive portions 142 of adjacent bumps 143. In another example, one or more of the bumps 143 may include a second shoulder 145, which may surround the conductive portion 142. In each of the bumps 143, the conductive portion 142 may extend from a top surface of the insulating body 141 via at least one sidewall of the insulating body 141 toward the second substrate 132 so that electrical connection between the first substrate 31 and the second substrate 32 may be achieved via the bonds 135 and the bumps 143 when electrically coupled. In one example, similar to the bumps 52, 52a and 52b respectively illustrated in FIGS. 2A and 2B, 3A and 3B, and 4A and 4B, or the bumps 82, 82a and 82b respectively illustrated in FIGS. 6A and 6B, 7A and 7B, and 8A and 8B, each of the bumps 143 may include at least one side wall free from the conductive portion 142. Furthermore, for any immediately adjacent bumps 143, one or more of the sidewalls facing each other may be free from the conductive portion 142.

FIGS. 14B, 14C and 14D are schematic diagrams each showing a cross-sectional view and a top view of a bump in accordance with examples of the present invention. Referring to FIG. 14B, a bump 143-1 similar to one of the bumps 143 shown in FIG. 14A may include the insulating body 141 and a conductive portion 142-1. The conductive portion 142-1 may cover a top surface 141-3 and sidewalls (not numbered) of the insulating body 141.

Referring to FIG. 14C, a bump 143-2 similar to one of the bumps 143 shown in FIG. 14A may include the insulating body 141 and a conductive portion 142-2. The conductive portion 142-2 may expose a portion of the top surface 141-3 and at least one sidewall 141-1 of the insulating body 141. The exposed portion of the top surface 141-3 of the insulating body 141 may subsequently form the first shoulder 144 as shown in FIG. 14A.

Referring to FIG. 14D, a bump 143-3 similar to one of the bumps 143 shown in FIG. 14A may include the insulating body 141 and a conductive portion 142-3. The conductive portion 142-3 may expose portions of the top surface 141-3 and at least one sidewall 141-1 and 141-2 of the insulating body 141. The exposed portions of the top surface 141-3 of the insulating body 141 may subsequently form the second shoulder 145 as shown in FIG. 14A.

Referring back to FIG. 14A, the ACA film 154 may include a multilayer structure formed by laminating conductive and non-conductive films. In the present example, the ACA film 154, in the form of a two-layer structure, may include a first layer 151 and a second layer 152. The first layer 151 may include a non-conductive material such as a non-conductive film (NCF) or a non-conductive paste (NCP). The second layer 152 may include a conductive material such as an anisotropic conductive film (ACF) or an anisotropic conductive paste (ACP). The conductive particles 36 in the second layer 152 may each have a size or diameter ranging from approximately 2 to 10 µm, which may be significant to the height of the bonds 135 ranging from approximately 2 to 15 µm and the bond pitch "D" of approximately 5 µm when the short-circuiting issue is concerned. In one example, the ACA film 154 may be applied over the first substrate 131 by, for example, a coating process or other suitable processes with the first layer 151 facing toward the first substrate 131. In another example, the ACA film 154 may be applied over the second substrate 132 with the second layer 152 facing toward the second substrate 132.

When assembled, the first, non-conductive layer 151 may largely be positioned at the first substrate 131 side, which may facilitate electrical isolation between adjacent bonds 135. Moreover, the second, conductive layer 152 may largely be positioned at the second substrate 131 side or between the bonds 135 and the bumps 143, which may facilitate electrical coupling between corresponding bonds 135 and bumps 143.

Figure 15A:
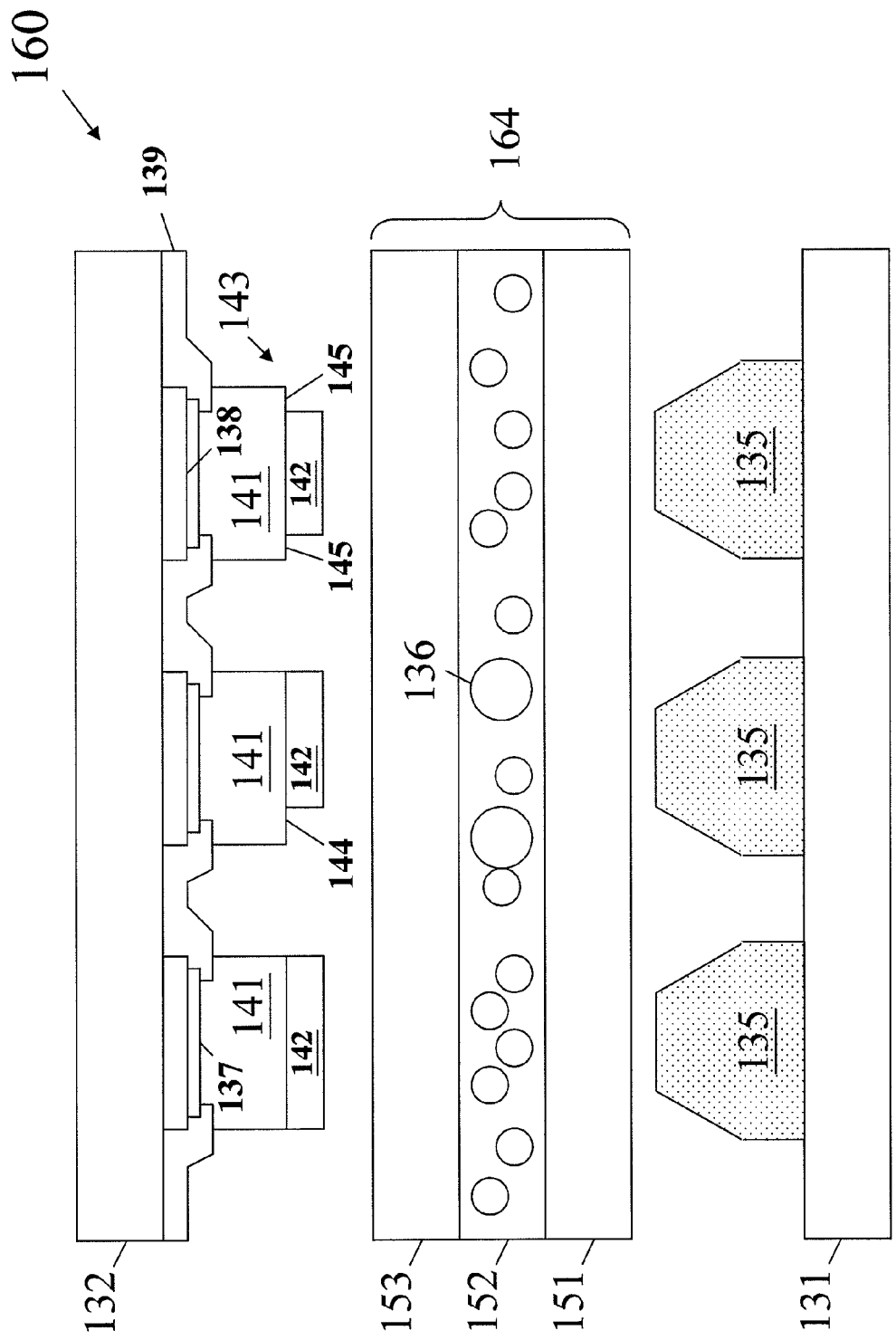
FIG. 15A is a schematic diagram of another exemplary electronic assembly before assembled.

FIG. 15A is a schematic diagram of another exemplary electronic assembly 160 before assembled. Referring to FIG. 15A, the electronic assembly 160 may be similar to the electronic assembly 150 described and illustrated with reference to FIG. 14A except that, for example, an ACA film 164 may replace the ACF film 154. Specifically, the ACA film 164, in the form of a three-layer structure, may further include a third layer 153 in addition to the first layer 151 and the second layer 152. The third layer 153, like the first layer 151, may include a non-conductive material such as an NCF or NCP, and may sandwich the second layer 152 with the first layer 151. In one example, the ACA film 164 may be applied over the first substrate 131 by, for example, a coating process or other suitable processes with one of the first layer 151 and the third layer 153 facing toward the first substrate 131. In another example, the ACA film 164 may be applied over the second substrate 132 with one of the first layer 151 and the third layer 153 facing toward the second substrate 132.

When assembled, one of the non-conductive layers 151 and 153 may largely be positioned at the first substrate 131 side, which may facilitate electrical isolation between adjacent bonds 135. Furthermore, the other one of the non-conductive layers 151 and 153 may largely be positioned at the second substrate 132 side, which may facilitate electrical isolation between adjacent bumps 143. Moreover, the second, conductive layer 152 may largely be positioned between the bonds 135 and the bumps 143, which may facilitate electrical coupling between corresponding bonds 135 and bumps 143.

Figure 15B:
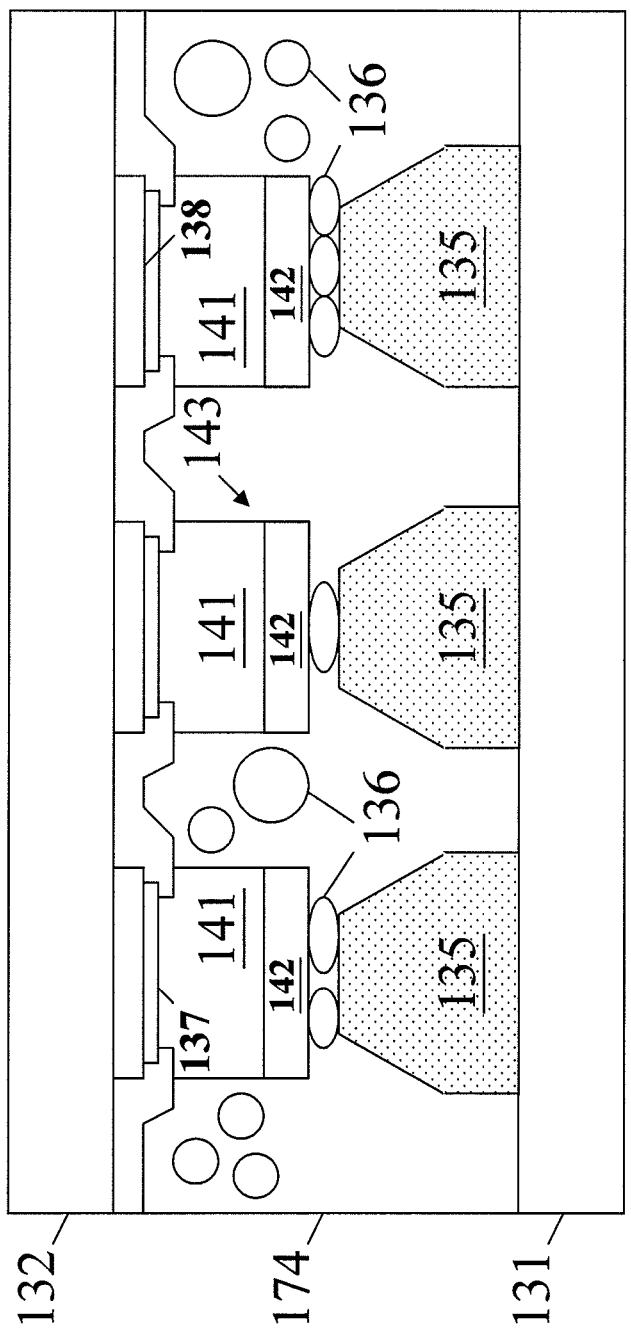
FIG. 15B is a schematic diagram of an exemplary electronic assembly after assembled.

FIG. 15B is a schematic diagram of an exemplary electronic assembly 170 after assembled. Referring to FIG. 15B, the electronic assembly 170 may include an ACA film 174. The ACA film 174 may include a multilayer structure similar to the two-layer ACA film 154 shown in FIG. 14A or the three-layer ACA film 164 shown in FIG. 15A. With the ACA film 174, the conductive particles 136 may largely be positioned at the second substrate 132 side or between the bonds 135 and bumps 143. That is, the conductive particles 136 may be positioned over the bonds 135 and therefore short-circuiting between adjacent bonds 135 due to the clustering or existence of the conducting particles 136 therebetween may be prevented.

With the increasing interest in compact, light-weight and low-profile electronic products, the devices and components thereof are manufactured with miniature feature sizes so as to meet the requirements for resolution. The progress in semiconductor manufacturing technologies, however, may satisfy most but not all of the demands for the down-sized electronic products and components. For example, due to the limitation of photolithography, in etching the bump-forming layer 66 such as a polyimide (PI) layer of the microelectronic structure 50 illustrated in FIG. 2A, the etched PI layer may result in the form of a truncated pyramid, of which the top area is smaller than the bottom area. Experiments reveal that such a truncated-pyramid form may adversely affect the capture rate of electronic particles when bump pitch is less than approximately 20 um. The capture rate may become worse as the bump pitch becomes smaller.

To address the issue of relatively fine bump pitch, in some examples according to the present invention, at least two conductive layers may be formed over a same bump-forming body. FIG. 16A is a schematic top view of an electronic device 180 in accordance with an example of the present invention. Referring to FIG. 16A, the electronic device 180, for example, an IC chip, may include a number of bump units 182 to 185 each comprising a bump-forming body, which extends in a first direction, and at least two conductive layers formed on the bump-forming body, which extend in a second direction substantially orthogonal to the first direction. For example, a representative bump unit 182 may include two conductive layers 191 formed on a bump-forming body 190. Furthermore, a representative bump unit 183 may include three conductive layers (not numbered) formed on a bump-forming body (not numbered). Likewise, a representative bump unit 184 may include four conductive layers (not numbered) formed on a bump-forming body (not numbered). Moreover, a representative bump unit 185 may include a row of conductive layers (not numbered) formed on a bump-forming body (not numbered). In the present example, the bump units 182 to 185 may be arranged along the peripheral of a substrate 187 of the electronic device 180. In other examples, however, at least one of the bump units 182 to 185 may be arranged at a central portion of the substrate 187.

FIG. 16B is an amplified view of bump units illustrated in FIG. 16A. Referring to FIG. 16B, the bump units may include a first bump unit 182-1 and a second bump unit 182-2 separated from each other by a distance "d". Taking the first bump unit 182-1 as an example, the first bump unit 182-1 may include a bump-forming body 190-1, a first conductive layer 191-1 and a second conductive layer 191-2. The first conductive layer 191-1 and the second conductive layer 191-2 may be formed over the bump-forming body 190-1 and separated from each other by a distance "S". A pitch "P" between two immediately adjacent conductive layers may be defined as the distance S plus the width "W" of a conductive layer, which renders P=S+W. In one example, given P of approximately 20 um, S and W may be approximately 9 um and 11 um, respectively. In another example, S and W respectively may be approximately 7 um and 3 um, given P of approximately 10 um. In still another example, S and W respectively may be approximately 4 um and 1 um, given P of approximately 5 um.

FIG. 16C is a schematic top view of an electronic device 181 in accordance with another example of the present invention. Referring to FIG. 16C, the electronic device 181 may be similar to the electronic device 180 described and illustrated with reference to FIG. 16A except, for example, a protection layer 194 disposed at a central portion of the substrate 187. The protection layer 194, similar to the protection layer 74 described and illustrated with reference to FIGS. 5 and 5A, may function to protect an underlying passivation layer (not shown) from damage.

Figure 17A:
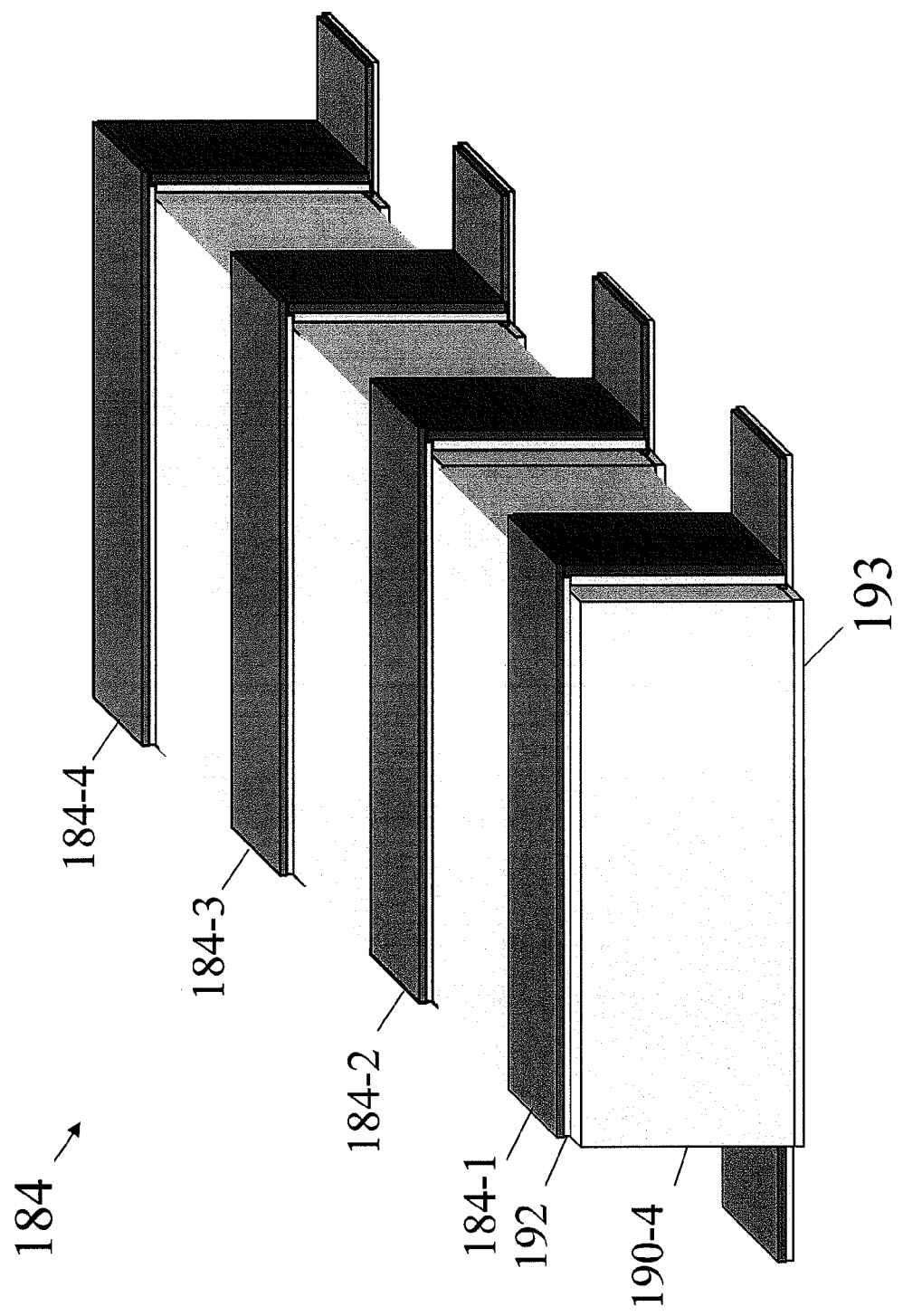
FIG. 17A is a schematic perspective view of a bump unit in accordance with an example of the present invention.

FIG. 17A is a schematic perspective view of a bump unit 184 in accordance with an example of the present invention. Referring to FIG. 17A, the bump unit 184 may include a bump-forming body 190-4 and conductive layers 184-1 to 184-4 formed over the bump-forming body 190-4. Taking the conductive layer 184-1 as an example, an adhesive layer 192 may be formed between the conductive layer 184-1 and the bump-forming body 190-4. The adhesive layer 192 may facilitate adhesion between the conductive layer 184-1 and the underlying bump-forming body 190-4. Moreover, a UBM layer 193 may be formed between the bump-forming body 190-4 and a substrate (not shown) such as the substrate 187 on which the bump unit 184 is disposed.

In one example, the bump-forming body 190-1 may include but is not limited to polyimide (PI) or other electrically insulating material. Furthermore, the adhesive layer 192 may include at least one of titanium (Ti), a titanium alloy such as titanium-tungsten (TiW) and titanium-nitrogen (TiN), chromium (Cr), chromium-copper (CrCu) or cobalt (Co). Each of the conductive layers 181-1 to 181-4 may include one or more of electrically conductive metal such as Au, Ag, Pt, Pd, Al, Cu, Sn and alloys thereof. Moreover, the UBM layer 193 may include but is not limited to one of TiW/Au and Cr/Au.

Figures 17B, 17C:
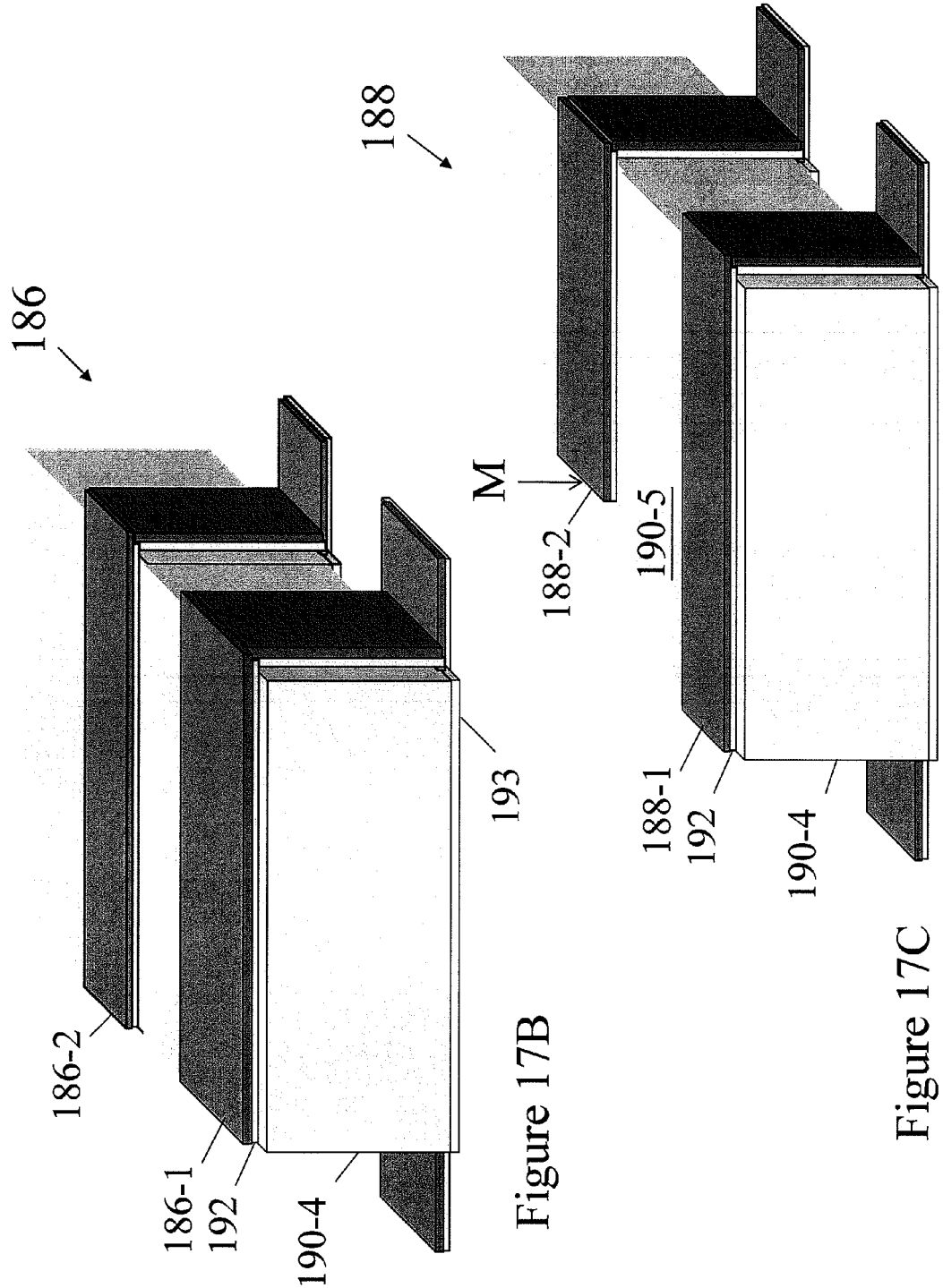
FIG. 17B is a schematic perspective view of a bump unit in accordance with another example of the present invention.
FIG. 17C is a schematic perspective view of a bump unit in accordance with still another example of the present invention.

FIG. 17B is a schematic perspective view of a bump unit 186 in accordance with another example of the present invention. Referring to FIG. 17B, the bump unit 186 may include a first conductive layer 186-1 and a second conductive layer 186-2. The first conductive layer 186-1 has a larger area than the second conductive layer 186-2.

FIG. 17C is a schematic perspective view of a bump unit 188 in accordance with still another example of the present invention. Referring to FIG. 17C, the bump unit 188 may include a first conductive layer 188-1 and a second conductive layer 188-2. The first conductive layer 188-1 extends across a top surface 190-5 of the bump-forming body 190-4. The second conductive layer 188-2 extends from a point M, for example, a midway point, on the top surface 190-5 toward the substrate.

Figure 18A:
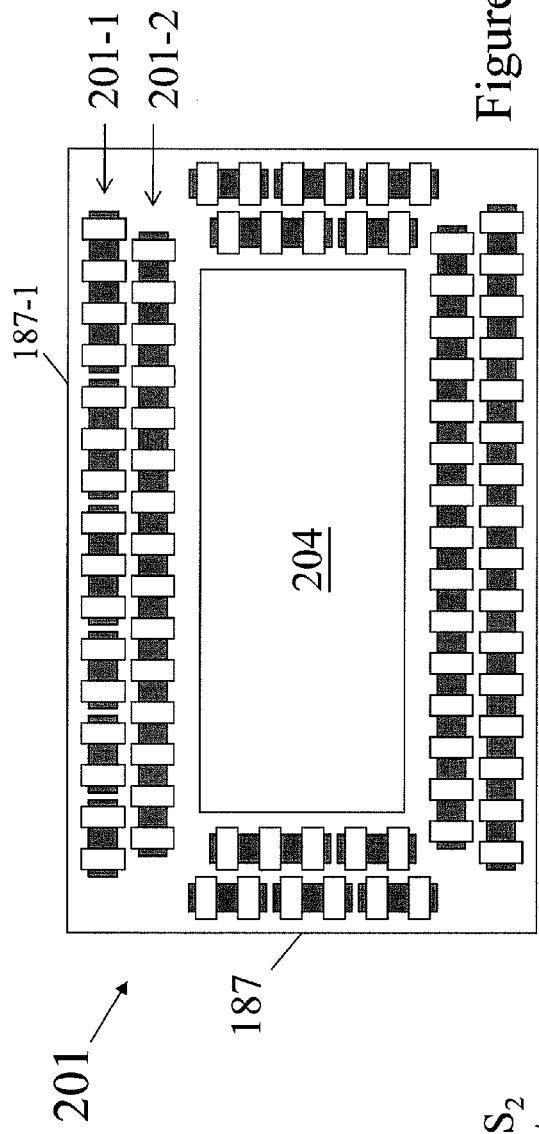
FIG. 18A is a schematic top view of an electronic device in accordance with still another example of the present invention.

FIG. 18A is a schematic top view of an electronic device 201 in accordance with still another example of the present invention. Referring to FIG. 18A, the electronic device 201 may be similar to the electronic device 180 described and illustrated with reference to FIG. 16A except that, for example, at least two rows of bump units may be arranged along at least one side of the substrate 187. For example, a first row of bump units 201-1 and a second row of bump units 201-2 may be arranged along a side 187-1 of the substrate 187. In the present example, conductive layers on the first row of bump units 201-1 and those on the second row of bump units 201-2 may be staggered with respect to each other. In other examples, at least a portion of the conductive layers on the first row 201-1 and the second row 201-2 may be aligned to each other. The electronic device 201 may optionally include a protection layer 204 at a central portion of the substrate 187.

Figure 18B:
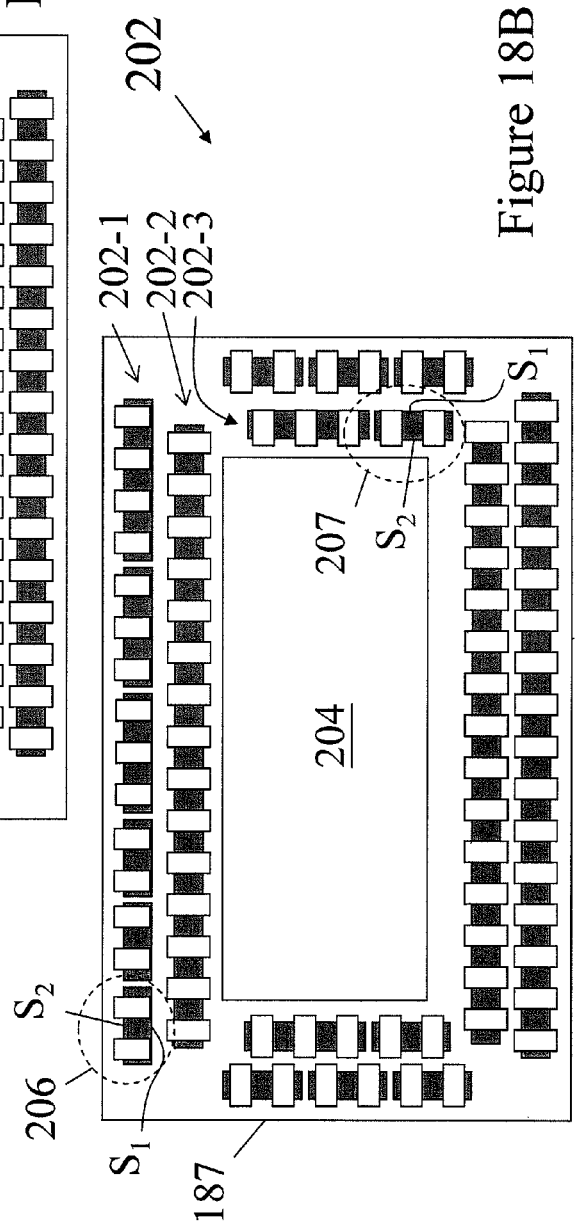
FIG. 18B is a schematic top view of an electronic device in accordance with yet another example of the present invention.

FIG. 18B is a schematic top view of an electronic device 202 in accordance with yet another example of the present invention. Referring to FIG. 18B, the electronic device 202 may be similar to the electronic device 201 described and illustrated with reference to FIG. 18A except, for example, a first row of bump units 202-1 and a third row of bump units 202-3. Specifically, as will be further illustrated in FIGS. 19A and 19B, a first side $S_1$ of a representative bump unit 206 on the first row 202-1 may be free from any conductive layers, which may avoid undesirable short-circuiting between adjacent conductive bumps. Similarly, a first side $S_1$ of a representative bump unit 207 on the third row 202-2 may also be free from any conductive layers.

Figure 19A:
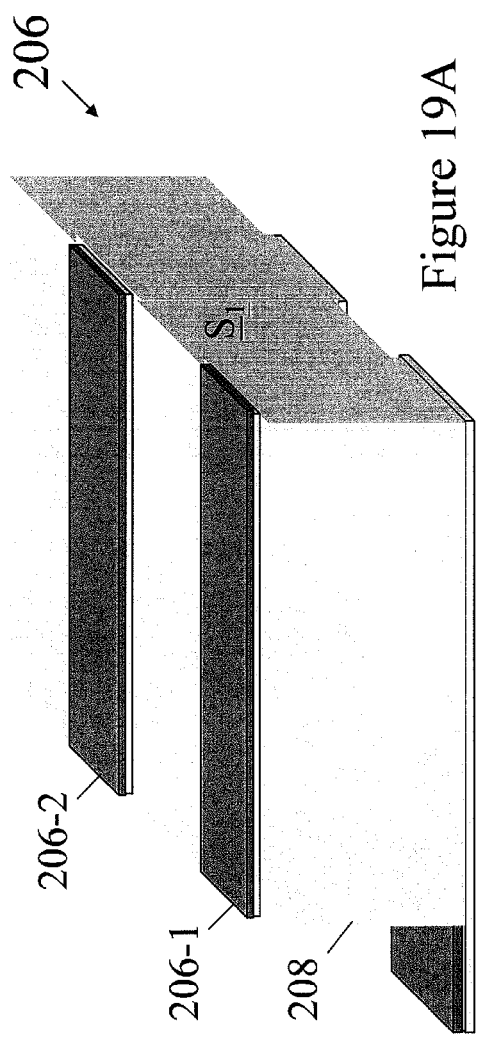
FIGS. 19A and 19B are schematic perspective views of a bump unit illustrated in FIG. 18B.
Figure 19B:
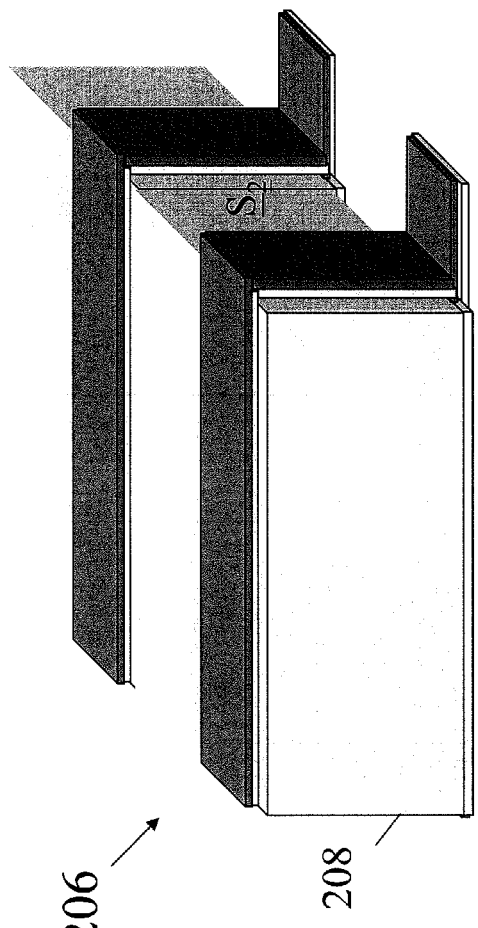

FIGS. 19A and 19B are schematic perspective views of a bump unit 206 illustrated in FIG. 18B. Referring to FIGS. 19A and 19B, the bump unit 206 may include a bump-forming body 208 and a first conductive layer 206-1 and a second conductive layer 206-2 formed over the bump-forming body 208. The bump-forming body 208 may include a first side $S_1$ facing toward a second row of bump units 202-2 and a second side $S_2$ facing away from the second row 202-2, wherein the first side $S_1$ of the bump-forming body 208 is free from conductive layers.

Figure 20A:
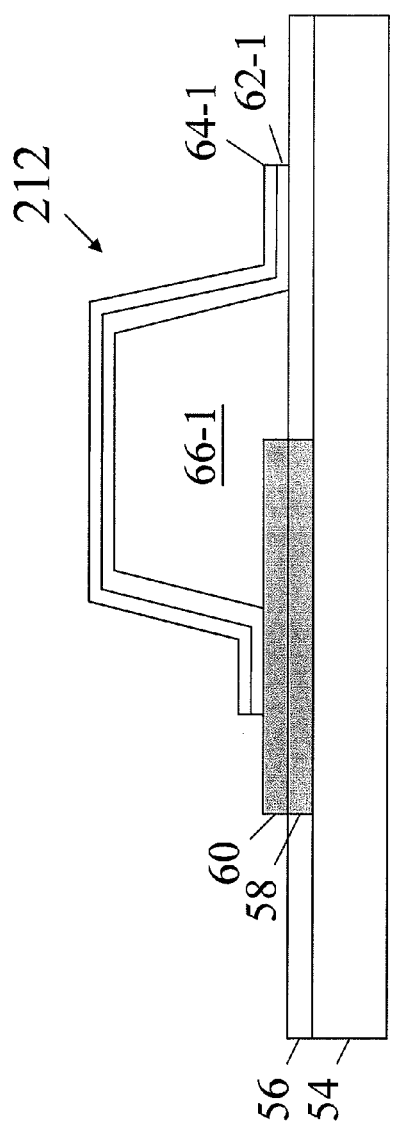
FIG. 20A is a schematic cross-sectional view of a conductive bump in accordance with an example of the present invention.

FIG. 20A is a schematic cross-sectional view of a conductive bump 212 in accordance with an example of the present invention. Referring to FIG. 20A, the conductive bump 212 may be similar to the conductive bump 52 described and illustrated with reference to FIG. 2A except, for example, the position of a bump-forming body 66-1, an adhesive layer 62-1 and a conductive layer 64-1. Specifically, the bump-forming body 66-1, adhesive layer 62-1 and conductive layer 64-1 may be offset from the UBM 58. In the present example, the bump-forming body 66-1, adhesive layer 62-1 and conductive layer 64-1 may overlap the passivation layer 56 and the UBM 58.

Figure 20B:
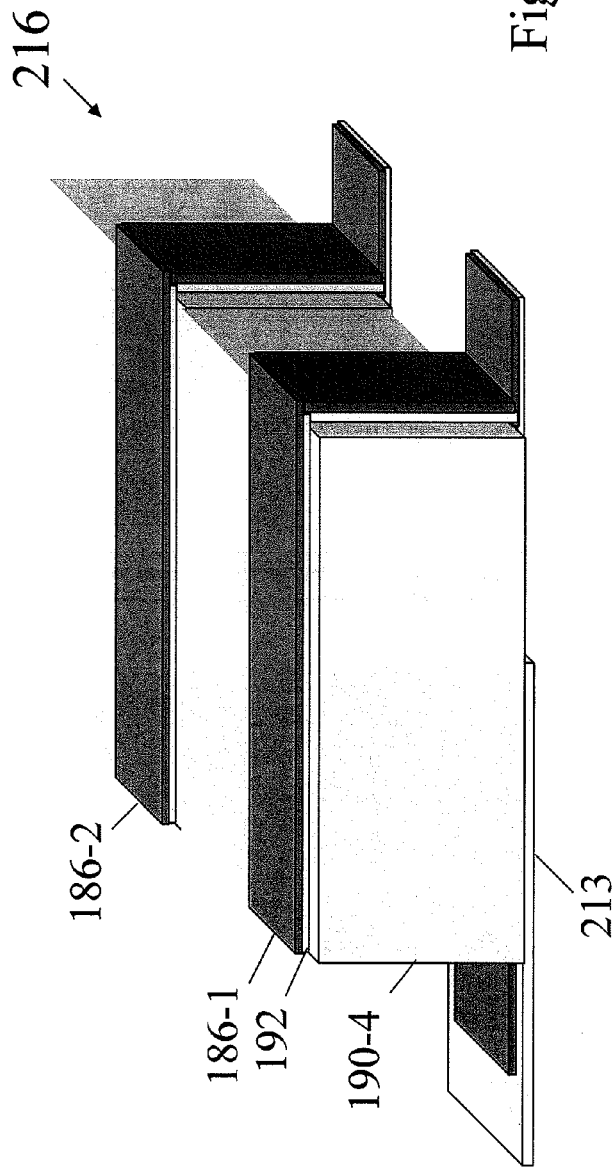
FIG. 20B is a schematic perspective view of a bump unit in accordance with still another example of the present invention.

FIG. 20B is a schematic perspective view of a bump unit 216 in accordance with still another example of the present invention. Referring to FIG. 20A, the bump unit 216 may be similar to the bump unit 186 described and illustrated with reference to FIG. 17B except, for example, the position of a UBM 213. Specifically, the UBM 213 may be offset from the bump-forming body 190-4, adhesive layer 192 and conductive layers 186-1 and 186-2. In the present example, the bump-forming body 190-4, adhesive layer 192 and conductive layers 186-1 and 186-2 may overlap a passivation layer (not shown) and the UBM 213.

Figure 21A:
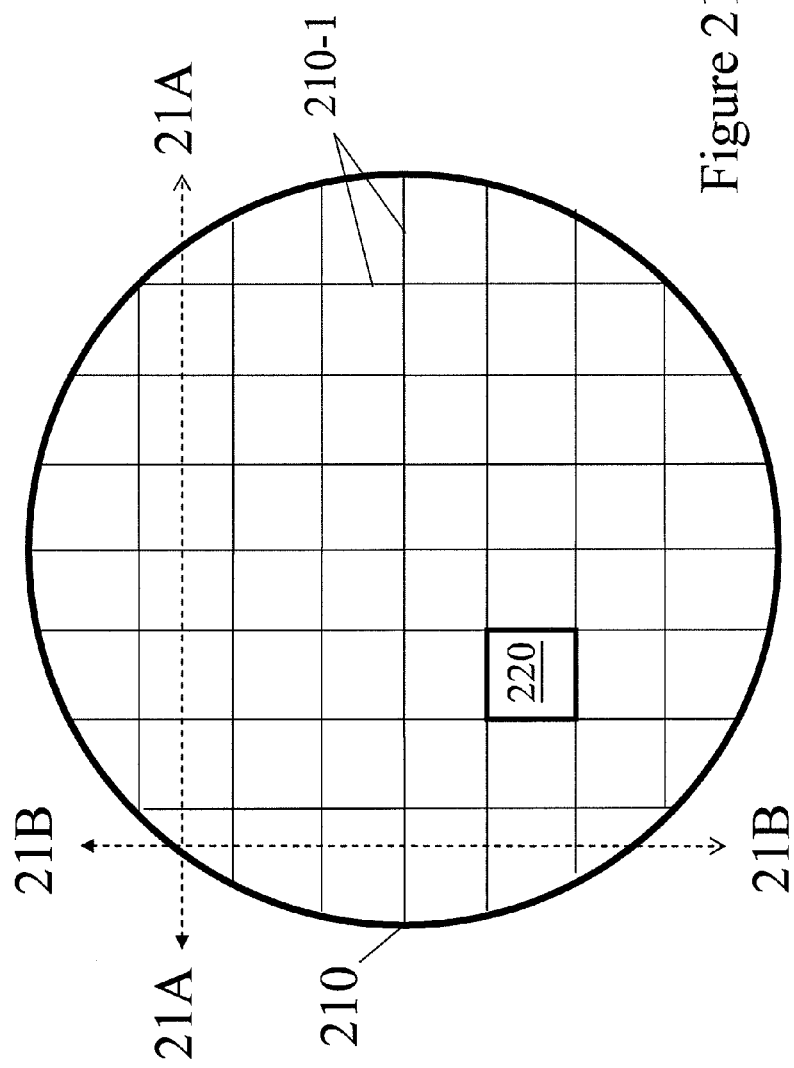
FIGS. 21A to 21G are schematic diagrams illustrating a method of forming electronic devices in a wafer level process in accordance with an example of the present invention.
Figure 21B:
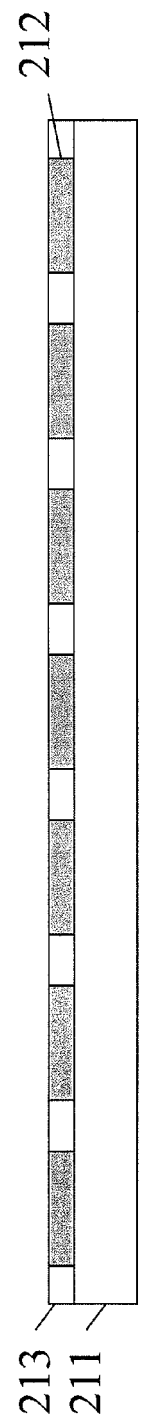

FIGS. 21A to 21G are schematic diagrams illustrating a method of forming electronic devices in a wafer level process in accordance with an example of the present invention. FIG. 21A is a schematic top view of a silicon wafer 210 on which the electronic devices are being fabricated and FIGS. 21B to 21G are cross-sectional views of the electronic devices taken along lines 21A-21A in FIG. 21A. Referring to FIG. 21B, a silicon substrate 211 may be prepared. A first patterned metal layer 212 may be formed by, for example, a sputtering process followed by an etching process. The first patterned metal layer 212 may include but is not limited to Al, which may serve as electrical contacts for the electronic devices being fabricated on the substrate 211.

Next, a patterned passivation layer 213 may be formed over the first patterned metal layer 212 by, for example, a CVD process followed by an etching process. The patterned passivation layer 213 may expose the first patterned metal layer 212. In one example, the patterned passivation layer 213 may include but is not limited to silicon oxide such as $SiO_2$ or silicon nitride such as $Si_3N_4$.

Figure 21C:
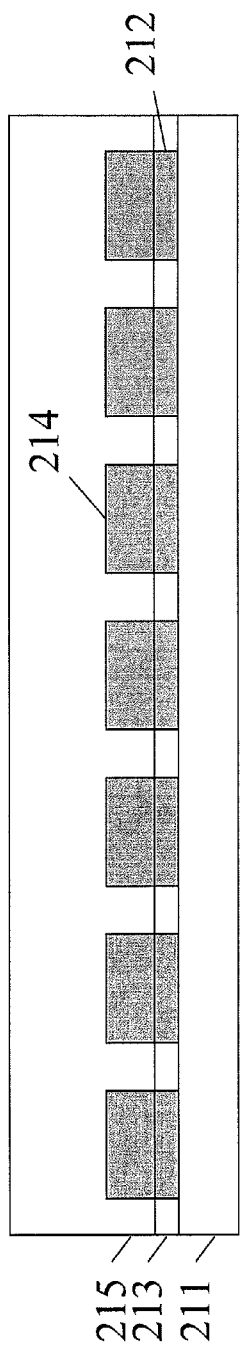

Referring to FIG. 21C, a second patterned metal layer 214 may be formed on the first patterned metal layer 212 by, for example, a sputtering process followed by an etching process. The second patterned metal layer 214 may include but is not limited to TiW/Au or Cr/Au, which may serve as UBMs for the electronic devices being fabricated.

Next, an insulating layer 215 such as a PI layer may be formed over the patterned passivation layer 213 and the second patterned metal layer 214 by, for example, a coating process.

Figure 21D:
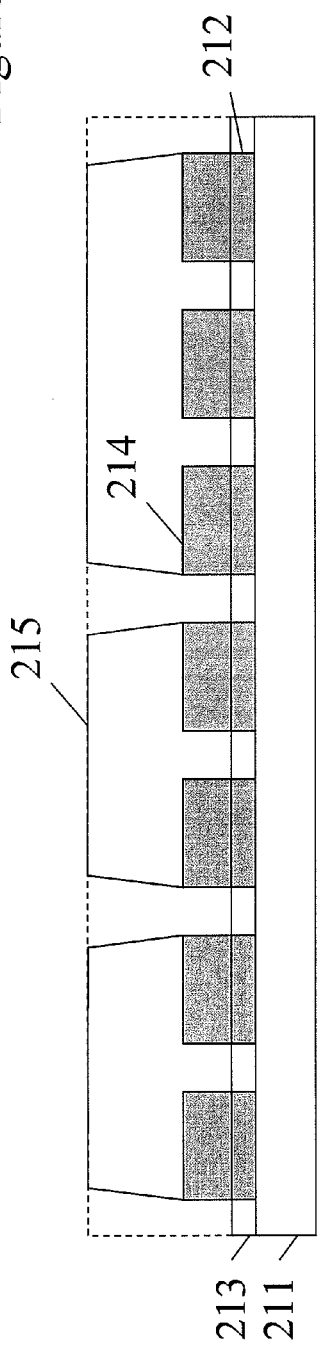

Referring to FIG. 21D, a patterned insulating layer 215' may be formed, which may serve as bump-forming bodies for the electronic devices being fabricated. Each of the bump-forming bodies may overlap at least two UBMs. In one example, the patterned insulating layer 215' may be disposed on the second patterned metal layer 214. In another example, when taken along lines 21B-21B in FIG. 21A, the patterned insulating layer 215' and the second patterned metal layer 214 may be offset from each other, as the bump unit 216 illustrated in FIG. 20B.

Figure 21E:
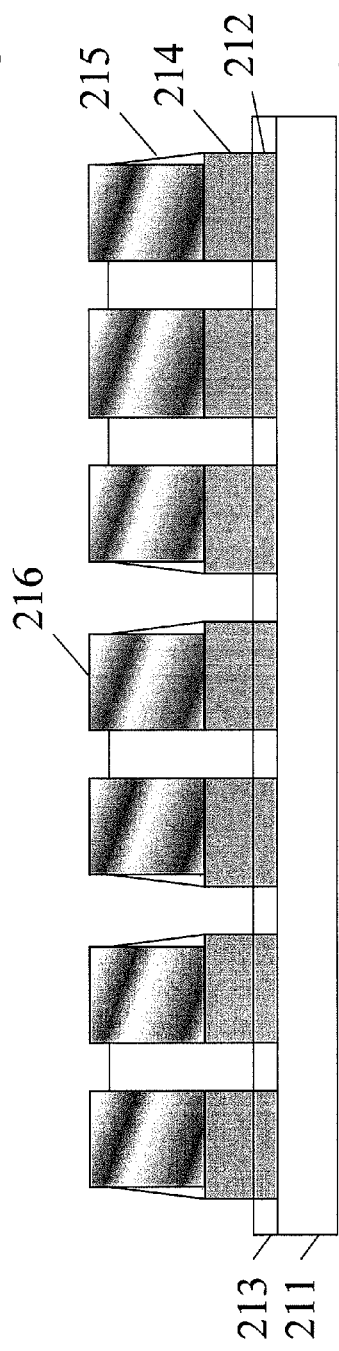

Referring to FIG. 21E, a third patterned metal layer 216 may be formed over the patterned insulating layer 215' by, for example, a sputtering process followed by an etching process. The third patterned metal layer 216 may include but is not limited to TiW/Au or Cr/Au.

Figure 21F:
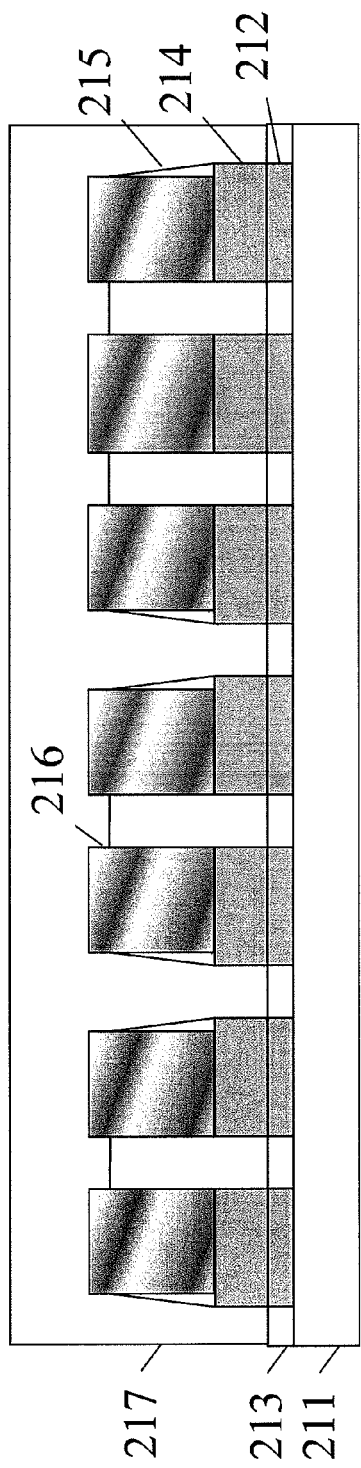

Next, referring to FIG. 21F, an adhesive layer 217 may be formed over the third patterned metal layer 216 by, for example, a coating or laminating process. In one example according to the present invention, the adhesive layer 217 may include one of an anisotropic conductive adhesive (ACA) and non-conductive adhesive (NCA), each of which may take the form of a film, paste or solution. Furthermore, the adhesive layer 217 may include a multiple-layer structure. For example, similar to the ACA film 154 described and illustrated with reference to FIG. 14A, the adhesive layer 217 may include a two-layer structure comprising an ACA layer and an NCA layer. Moreover, similar to the ACA film 164 described and illustrated with reference to FIG. 15A, the adhesive layer 217 may include a three-layer structure comprising an ACA layer sandwiched by two NCA layers.

After the adhesive layer 217 is applied over the wafer 210, referring back to FIG. 21A, a dicing process may be performed by cutting the wafer 210 into chips 220 along scriber lines 210-1. Each of the chips 220 may include electronic devices formed by the steps illustrated in FIGS. 21B to 21E.

Figure 21G:
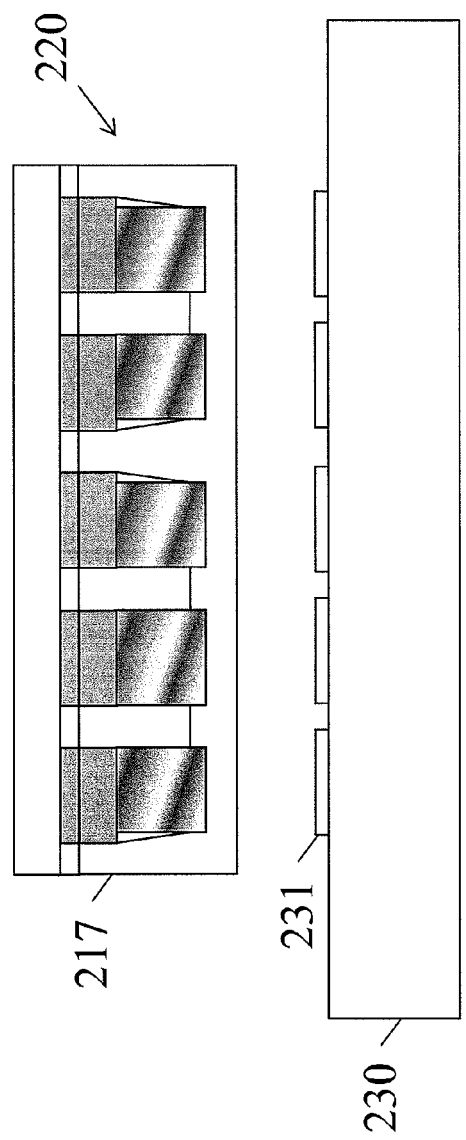

Next, referring to FIG. 21G, the chip 220 may be bonded to a substrate 230 formed with bonds 231 in, for example, a flip-chip bonding process. In one example, the substrate 230 may include a polymer, silicon or glass substrate. Furthermore, the bonds 231 may include indium tin oxide (ITO), copper or Au.

Figure 22A:
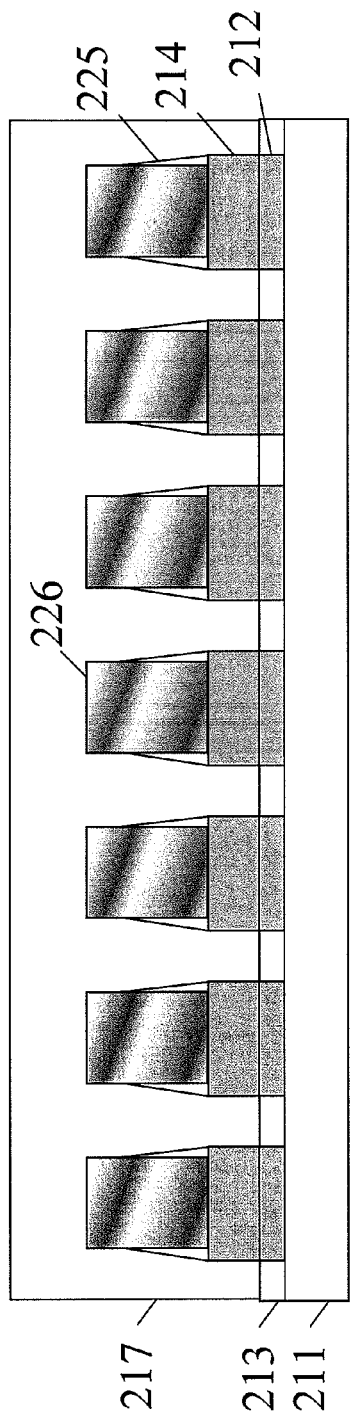
FIGS. 22A and 22B are schematic diagrams illustrating a method of forming electronic devices in a wafer level process in accordance with another example of the present invention.
Figure 22B:
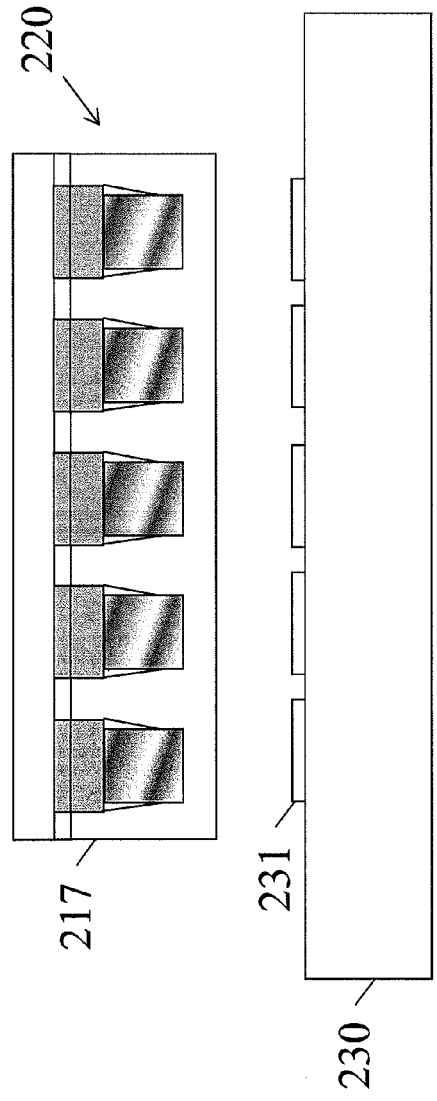

FIGS. 22A and 22B are schematic diagrams illustrating a method of forming electronic devices in a wafer level process in accordance with another example of the present invention. The method may include steps similar to those described and illustrated with reference to FIGS. 21B and 21C. Next, instead of forming the patterned insulating layer 215' wherein each bump-forming body overlaps at least two UBMs as illustrated in FIG. 21 D, referring to FIG. 22A, a patterned insulating layer 225' may be formed over the second patterned metal layer 214, wherein each bump-forming body overlaps a single UBM. Subsequently, a third patterned metal layer 226 may be formed. Consequently, a conductive bump thus formed may be similar to the conductive bump 52a described and illustrated with reference to FIG. 12I.

Next, the adhesive layer 217 may be formed over the third patterned metal layer 226 by a coating or laminating process. After the adhesive layer 217 is applied, a dicing process may be performed, resulting in a number of chips.

Referring to FIG. 22B, a representative chip 220' may be bonded to a substrate 230 formed with bonds 231 in, for example, a flip-chip bonding process.

It will be appreciated by those skilled in the art that changes could be made to the preferred embodiments described above without departing from the broad inventive concept thereof. It is understood, therefore, that this invention is not limited to the particular embodiments disclosed, but is intended to cover modifications within the spirit and scope of the present application as defined by the appended claims.

Further, in describing representative embodiments of the present invention, the specification may have presented the method and/or process of the present invention as a particular sequence of steps. However, to the extent that the method or process does not rely on the particular order of steps set forth herein, the method or process should not be limited to the particular sequence of steps described. As one of ordinary skill in the art would appreciate, other sequences of steps may be possible. Therefore, the particular order of the steps set forth in the specification should not be construed as limitations on the claims. In addition, the claims directed to the method and/or process of the present invention should not be limited to the performance of their steps in the order written, and one skilled in the art can readily appreciate that the sequences may be varied and still remain within the spirit and scope of the present invention.

That which is claimed is:

1. An electronic device comprising:
 a substrate;
 a number of conductive bond pads on the substrate and configured to electrically contact one or more integrated circuits; and
 a number of bump units over the substrate, wherein each of the bump units includes:
 an electrically insulating bump-forming body disposed at least partially over one or more of the conductive bond pads and extending longitudinally in a first direction in a greater amount than a second direction, wherein a portion of the one or more of the conductive bond pads is vertically aligned and disposed under a width of the bump-forming body;
 at least two conductive layers separated from each other and disposed on the electrically insulating bump-forming body such that the electrically insulating bump-forming body rests between the substrate and the at least two conductive layers, the at least two conductive layers extending longitudinally in the second direction, wherein the second direction is orthogonal to the first direction;
 wherein the one or more of the conductive bond pads extend longitudinally in the second direction,
 wherein the electrically insulating bump-forming body includes a top surface, a first sidewall and a second sidewall, and wherein one of the at least two conductive layers extends from a point disposed on the top surface between the first and second sidewalls toward the substrate via one of the first sidewall or the second sidewall,
 wherein one of the at least two conductive layers has a greater width than the other of the at least two conductive layers, and
 wherein the first direction and the second direction are disposed on a plane coplanar with the substrate.

2. The electronic device of claim 1, wherein the electrically insulating bump-forming body includes a top surface, a first sidewall and a second sidewall, and wherein one of the at least two conductive layers extends longitudinally across the first sidewall, the top surface and the second sidewall.

3. The electronic device of claim 1 further comprising a number of under bump metal (UBM) layers disposed on respective ones of the conductive bond pads, wherein the electrically insulating bump-forming body of each of the bump units is disposed on one or more of the UBM layers.

4. The electronic device of claim 1 further comprising a number of under bump metal (UBM) layers disposed on respective ones of the conductive bond pads, wherein the electrically insulating bump-forming body of each of the bump units is disposed on one or more of the UBM layers and arranged at a position offset from the respective one or more of the UBM layers.

5. The electronic device of claim 1, wherein each of the at least two conductive layers includes a first metal layer on the electrically insulating bump-forming body and a second metal layer on the first metal layer.

6. An electronic device comprising:
a substrate;
a number of conductive bond pads on the substrate and configured to electrically contact one or more integrated circuits;
a first row of bump units over the substrate; and
a second row of bump units adjacent to the first row of bump units over the substrate, wherein each of the first and second rows of bump units includes:
an electrically insulating bump-forming body disposed at least partially over one or more of the conductive bond pads and extending longitudinally in a first direction in a greater amount than a second direction, wherein a portion of the one or more of the conductive bond pads is vertically aligned and disposed under a width of the bump-forming body;
at least two conductive layers separated from each other and disposed on the electrically insulating bump-forming body such that the electrically insulating bump-forming body rests between the substrate and the at least two conductive layers, the at least two conductive layers extending longitudinally in the second direction, wherein the second direction is orthogonal to the first direction,
wherein the one or more of the conductive bond pads extend longitudinally in the second direction,
wherein the electrically insulating bump-forming body of at least one of the first or second rows of bump units includes a top surface, and a first sidewall and a second sidewall that extend longitudinally in the first direction, and wherein one of the at least two conductive layers of the at least one of the first and second rows of bump units extends longitudinally from a point disposed on the top surface between the first and second sidewalls across one of the first sidewall or the second sidewall toward the substrate,
wherein the first direction and the second direction are disposed on a plane coplanar with the substrate,
wherein one of the at least two conductive layers of at least one of the first and second row of bump units has a greater width than the other one of the at least two conductive layers, and
wherein a first side of the first row of bump units and a second side of the second row of bump units are opposed to each other, and at least one of the first side or the second side is free from the at least two conductive layers.

7. The electronic device of claim 6, wherein the at least two conductive layers of the first row of bumps units are staggered in position to the at least two conductive layers of the second row of bumps units.

8. The electronic device of claim 6, wherein the electrically insulating bump-forming body of one of the first and second rows of bump units includes a top surface, and a first sidewall and a second sidewall that extend longitudinally in the first direction, and wherein one of the at least two conductive layers of the at least one of the first or second rows of bump units extends longitudinally across the first sidewall, the top surface and the second sidewall.

9. The electronic device of claim 6 further comprising a number of under bump metal (UBM) layers disposed on respective ones of the conductive bond pads, wherein the electrically insulating bump-forming body of each of the bump units of at least one of the first and second row of bump units is disposed on one or more of the UBM layers.

10. The electronic device of claim 6 further comprising a number of under bump metal (UBM) layers disposed on respective ones of the conductive bond pads, wherein the electrically insulating bump-forming body of each of the bump units of at least one of the first and second row of bump units is disposed on one or more of the UBM layers and arranged at a position offset from the respective one or more of the UBM layers.

11. The electronic device of claim 6, wherein each of the at least two conductive layers of at least one of the first and second row of bump units includes a first metal layer on the electrically insulating bump-forming body and a second metal layer on the first metal layer.

12. The electronic device of claim 6, wherein the conductive layer of the first row of bump units extends longitudinally across the top surface and the second sidewall,
wherein the conductive layer of the second row of bump units extends longitudinally across the first sidewall, the top surface and the second sidewall, and
wherein the first sidewall of the electrically insulating bump-forming body of the first row of bump units is disposed opposite from the second sidewall of the electrically insulating bump-forming body of the second row of bump units.

13. The electronic device of claim 6, wherein the conductive layer of the first row of bump units extends longitudinally across the first sidewall, the top surface and the second sidewall,
wherein the conductive layer of the second row of bump units extends longitudinally across the first sidewall and the top surface, and
wherein the first sidewall of the electrically insulating bump-forming body of the first row of bump units is disposed opposite from the second sidewall of the electrically insulating bump-forming body of the second row of bump units.

14. The electronic device of claim 6, wherein the conductive layer of the first row of bump units extends longitudinally across the top surface and the second sidewall,
wherein the conductive layer of the second row of bump units extends longitudinally across the first sidewall and the top surface, and
wherein the first sidewall of the electrically insulating bump-forming body of the first row of bump units is disposed opposite from the second sidewall of the electrically insulating bump-forming body of the second row of bump units.

* * * * *